(12) United States Patent
Nakamura et al.

(10) Patent No.: US 6,421,807 B1
(45) Date of Patent: Jul. 16, 2002

(54) DECODING APPARATUS, PROCESSING APPARATUS AND METHODS THEREFOR

(75) Inventors: Akio Nakamura, Kawasaki; Tetsuya Tamura, Yamato; Masayuki Demura, Ebina; Hironobu Nagura, Yokohama, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,946

(22) Filed: Jun. 30, 1999

(30) Foreign Application Priority Data

Jun. 30, 1998 (JP) .......................................... 10-184827

(51) Int. Cl.⁷ ............................................ H03M 13/00
(52) U.S. Cl. ..................................................... 714/781
(58) Field of Search ................................. 714/769, 701, 714/784, 785, 765, 781, 755, 795–796; 360/53, 25, 75; 708/492; 712/209–213, 200, 245–248; 711/213, 217

(56) References Cited

U.S. PATENT DOCUMENTS

| | | | | |
|---|---|---|---|---|
| 4,162,480 A | * | 7/1979 | Berlekamp | 714/784 |
| 5,642,367 A | * | 6/1997 | Kao | 714/784 |
| 5,715,262 A | * | 2/1998 | Gupta | 714/784 |
| 5,983,383 A | * | 11/1999 | Wolf | 714/755 |
| 6,212,659 B1 | * | 4/2001 | Zehavi | 717/755 |

FOREIGN PATENT DOCUMENTS

| | | | |
|---|---|---|---|
| JP | 6-164421 | 6/1994 | .......... H03M/13/00 |
| JP | 7-50594 | 2/1995 | .......... H03M/13/00 |

OTHER PUBLICATIONS

Hung–Wei Chen et al. (A new VLSI architecture of Reed Solomon decoder with erasure function; IEEE; pp. 1455–1459 vol 2; 13–17 Nov. 1995).*

* cited by examiner

*Primary Examiner*—Albert Decady
*Assistant Examiner*—Gur Lamarre
(74) *Attorney, Agent, or Firm*—G. Marlin Knight; Ron Feece

(57) ABSTRACT

An apparatus and method for decoding data encoded in a linear cyclic code with less hardware than the prior art decoding apparatus without sacrificing the processing speed are described. The polynomial arithmetic part 14 derives polynomials $\sigma(x)$, $\omega(x)$ by repeating calculation of the following $Q_i(x)$, exchange of polynomials between the register U_reg 180 and the register X_reg 184, and exchange of polynomials between the register Y_reg 182 and the register Z_reg 186 until the degree (deg Xreg) of the polynomial in the register X_reg 184 becomes smaller than $[(d-h+1)/2]$ to solve the following recursive formula.

[recursive formula]=$\sigma_i(x)=\sigma_{i-2}(x)+Q_i(x)\cdot\sigma_{i-1}(x)$ $\omega_i(x)=\omega_{i-2}(x)+Q_i(x)\cdot\omega_{i-1}(x)$ where $Q_i(x)$ is a quotient of $\omega_{i-2}(x)/\omega_{i-1}(x)$ $\sigma_{-1}(x)=1$, $\omega_{-1}(x)=x^{2t}$ $\sigma_0(x)=1$, $\omega_0(x)=M(x)$

5 Claims, 12 Drawing Sheets

Decoding Apparatus

DECODING APPARATUS, PROCESSING APPARATUS AND METHODS THEREFOR

FIELD OF THE INVENTION

This invention relates to a decoding apparatus and method for decoding data encoded in a linear cyclic code.

BACKGROUND OF THE INVENTION

The Peterson method, Berlekamp-Massey method and Euclidean method are known generally as methods of obtaining an error position polynomial indicating a position of a symbol within a received word polynomial where an error occurs and an error evaluator polynomial indicating the value of the error of the symbol in decoding a linear cyclic code, "A Method for Solving Key Equation for Decoding Goppa Codes, Y. Sugiyama, M. Kasahara, S. Hirasawa and N. Namekawa, Inform. and Contr., Vol. 27, pp 87–99, January 1975" (reference 1) discloses a Euclidean method.

"An erasures-Errors Decoding Algorithm for Goppa Codes (Y. Sugiyama, M. Kasahara and N. Namekawa, IEEE Trans., Inform. Theory, March 1976" (reference 2) discloses that the Euclidean method can be applied to error erasure and correction processing by calculating an updated syndrome, i.e., by multiplying a syndrome polynomial with an erasure locator polynomial and erasing the (d−1) th degree term where "d" is the minimum Hamming distance of the code ("d" is an odd number unless specifically mentioned).

The Euclidean method involves a computation load which is equal to or less than other methods. In addition, the Euclidean method is conveniently implemented in a hardware because computation is easily paralleled.

For example, Japanese PUPA 62-122332 discloses an apparatus in which the Euclidean method is implemented in a hardware. The apparatus disclosed in this reference (3) is so configured as to successively calculate an updated syndrome and a GCD (greatest common divisor) of two polynomials, and processes error erasure by using a systolic array technology.

In the apparatus disclosed in the reference 3, it is necessary for each calculating cell to be provided with a latch for holding information/status and multiplier/adder for calculation.

Japanese PUPA 7-202718 (reference 4), for example, discloses a decoding apparatus which comprises a less amount of hardware than the apparatus disclosed in the reference 2 by using a polynomial arithmetic processing circuit rather than a systolic array.

SUMMARY OF THE INVENTION

This invention provides a decoding apparatus and a method which allows data encoded in a linear cyclic code to be decoded with less hardware than the prior art decoding apparatus.

It is a further object of this invention to provide a decoding apparatus, an arithmetic apparatus and a method therefor which allows a linear cyclic code to be decoded in a speed equal to or higher than the prior art decoding apparatus with less hardware than the prior art decoding apparatus.

In order to achieve the above objectives, the decoding apparatus of this invention comprises erasure locator data calculating means for calculating erasure locator data $\alpha^i$ indicating the locator of erasure occurring in a linear cyclic code $R(x)$, syndrome polynomial calculating means for calculating a syndrome polynomial $S(x)$ based on said calculated erasure locator data $\alpha^i$ and said linear cyclic code $R(x)$, updated syndrome polynomial calculating means for calculating an updated syndrome polynomial $M(x)$ based on said erasure locator data $\alpha^i$ and said calculated syndrome polynomial $S(x)$, polynomial calculating means for calculating an error position polynomial $\sigma(x)$ an erasure locator polynomial $\lambda(x)$ and an error evaluator polynomial $\omega(x)$ based on said erasure locator data $\alpha^i$ and said calculated updated syndrome polynomial $M(x)$, and decoding means for calculating an error/erasure value $e_i/E_i$ to correct the error/erasure in said linear cyclic code $R(x)$ for decoding based on said calculated error position polynomial $\sigma(x)$ said calculated erasure locator polynomial $\lambda(x)$, said calculated error evaluator polynomial $\omega(x)$, said error position data $\alpha^i$, and said linear cyclic code $R(x)$, said polynomial calculating means repeating recursive formulas;

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-i}(x)=1$, $\omega_{-i}(x)=x^{2t}$, $\sigma_o(x)=1$, $\omega_o(x)=M(x)$, until the degree of the polynomial $\omega_i$ becomes equal to or less than $[(d+h-1)/2-1]$ (where [ ] is a Gauss symbol, d is a minimum Hamming distance and h is the number of erasures) to calculate the error position polynomial $\sigma(x)$ and the error evaluator polynomial $\omega(x)$ for deriving the erasure locator polynomial $\lambda(x)$ from said erasure locator data $\alpha^i$.

The decoding apparatus of this invention solves $$S(x)\cdot\sigma(x)\cdot\lambda(x)=\omega(x) \bmod (x) \qquad \text{(expression 12)}$$

using the Euclidean method to derive the error evaluator polynomial $\omega(x)$ and the error position polynomial $\sigma(x)$ for decoding a linear cyclic code such as BHC code. Rewriting the expression 12 by using the updated syndrome polynomial $M(x)=S(x)\cdot(x) \bmod x^{d-1}$, $\phi(x)\cdot x^{d-1}\pm M(x)\cdot\sigma(x)=\omega(x)$ (expression 14) is obtained. The error position polynomial $\sigma(x)$ and the error evaluator polynomial $\omega(x)$ can be uniquely obtained from this expression 14 except for the difference of a multiple of constant.

The polynomial calculating means of the decoding apparatus of this invention uses the expression;

$$\lambda_i(x)x^{2t}+\sigma_i(x)\cdot M(x)=\omega_i(x)$$

(expression 16) Initial condition $$\lambda_{-1}(x)=1,\ \sigma_{-1}(x)=0,\ \omega_{-1}(x)=X^{2t},\ \lambda_0(x)=1,$$

$$\sigma_0(x)=0,\ \omega_0(x)=M(x))$$

for solving the expression 14 using the Euclidean method.

The expression 16 can be expressed in the form of a recursive formula given below and the polynomial calculating means derives the error position polynomial $\sigma(x)$ and the error evaluator polynomial $\omega(x)$ by repeating the following recursive formula until the condition deg $\omega(x)\leq[(d+h-1)/2]-1$ is satisfied:

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{1-1}(x)$$

where $Q_i(x)$ is quotient of $\omega_{i-2}(x)/\omega_{i-1}(x)$,

The erasure locator polynomial $\lambda(x)$ is further calculated from the erasure locator data $\alpha^i$ as shown in the expression 8.

The decoding means obtains an error value $e_i$ and an erasure value $E_i$ to correct a received word by substituting the expressions $$e_i=\omega(\alpha^{-ji})/\{\alpha^{-ji}\cdot\alpha'(\alpha^{-ji})\cdot\lambda(\alpha^{-ji})\}, \quad (23)$$

$$E_i=\omega(\alpha^{-j'i})/\{\alpha^{-j'i}\cdot\alpha'(\alpha^{-j'i})\cdot\lambda(\alpha^{-j'i})\} \quad (24)$$

with the erasure locator polynomial $\lambda(x)$, the error position polynomial $\sigma(x)$ and the error evaluator polynomial $\omega(x)$ so obtained for correcting the received word to decode it.

The arithmetic apparatus of this invention calculates the error position polynomial $\sigma(x)$ and the error evaluator polynomial $\omega(x)$ from the updated syndrome polynomial $M(x)$ which is calculated from the erasure locator data $\alpha^i$ indicating the locator of an erasure in the linear cyclic code $R(x)$ and the syndrome polynomial $S(x)$ which is calculated from said erasure locator data $\alpha^i$ and said linear cyclic code $R(x)$. Said arithmetic apparatus repeats recursive formulas;

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-i}(x)=1$, $\omega_{-i}(x)=x^{2t}$, $\sigma_0(x)=1$, $\omega_0(x)=M(x)$, until the degree of the polynomial $\omega_i$ becomes equal to or less than $[(d+h-1)/2-1]$ (where [ ] is a Gauss symbol, d is a minimum Hamming distance and h is the number of erasures) to calculate the error position polynomial $\sigma(x)$ and the error evaluator polynomial $\omega(x)$.

Preferably, said arithmetic apparatus comprises; two first registers (registers U, X) having a data width equal □□ to or greater than $k\cdot(d-1)/2$ bits (where k is the data length of a symbol included in said linear cyclic code), two second registers (registers Y, Z) having a data width equal to or greater than $k\cdot(d-1)/2$ bits (where k is the data length of a symbol included in said linear cyclic code), multiplier/divider means for multiplying/dividing two multiplication/division data items, a data selector for selecting two of polynomials held by said registers, said erasure locator data $\alpha^i$ and the result of said multiplication/division to generate said two multiplication/division data items, a first adder means for adding said result of multiplication/division to the data held in one of said first registers, a second adder means for adding said result of multiplication/division to the data held in one of said first registers, a shifter for shifting said result of multiplication/division, and arithmetic control means for causing these means to execute arithmetic processing to solve said recursive formula.

Preferably, said arithmetic control means causes one of said first registers (register U), the other one of said first registers (register X), one of said second registers (register Y), and the other one of said second registers (register Z) to hold said updated syndrome polynomial $M(x)$, a coefficient $x^{d-1}$ of said linear cyclic code $R(x)$, and values 0 and 1, respectively, and repeats an arithmetic operation for calculating said $Q(x)$ and an exchange processing of the polynomial held in said register X to derive said error evaluator polynomial $\omega(x)$ in said register X and said error position polynomial $\sigma(x)$ in said register Z.

The arithmetic operation to calculate said $Q(x)$ calculates the highest degree term Q of the quotient of a division of the polynomial held in said register U by the polynomial held in said register X, and repeats a process of causing said register U to hold a polynomial derived by subtracting the result of a multiplication of the polynomial held in said register X with the calculated term Q from the polynomial held in said register X and a process of causing said register Y to hold a polynomial derived by subtracting the result of a multiplication of the polynomial held in said register Y with the calculated term Q from the polynomial held in said register X until the degree of the polynomial held in said register U becomes less than the degree of the polynomial held in said register X.

The exchange of the polynomials held in said registers causes the polynomial held in said register U to be exchanged with the polynomial held in said register X, and causes the polynomial held in said register Y to be exchanged with the polynomial held in said register Z.

Decoding Method

The decoding method of this invention comprises; an erasure locator data calculating step for calculating erasure locator data $\alpha^i$ indicating the locator of an erasure occurring in a linear cyclic code $R(x)$, a syndrome polynomial calculating step for calculating a syndrome polynomial $S(x)$ based on said calculated erasure locator data $\alpha^i$ and said linear cyclic code $R(x)$, an updated syndrome polynomial calculating step for calculating an updated syndrome polynomial $M(x)$ based on said erasure locator data a and said calculated syndrome polynomial $S(x)$, a polynomial calculating step for calculating an error position polynomial $\sigma(x)$, an erasure locator polynomial $\lambda(x)$ and an error evaluator polynomial $\omega(x)$ based on said erasure locator data $\alpha^i$ and said calculated updated syndrome polynomial $M(x)$, and a decoding step for calculating error/erasure values $e_i/E_i$ based on said calculated error position polynomial $\sigma(x)$, said calculated erasure locator polynomial $\lambda(x)$, said calculated error evaluator polynomial $\omega(x)$, said error position data $\alpha^i$, and said linear cyclic code $R(x)$ to correct an error/erasure in said linear cyclic code $R(x)$ for decoding, said polynomial calculating step including;

a process of repeating a recursive formula:

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-i}(x)=1$, $\omega_{-i}(x)=x^{2t}$, $\sigma_0(x)=1$, $\omega_0(x)=M(x)$, until the degree of the polynomial $\omega_i$ becomes equal to or less than $[(d+h-1)/2-1]$ (where [ ] is a Gauss symbol, d is a minimum Hamming distance and h is the number of erasures) to calculate the error position polynomial $\sigma(x)$ and the error evaluator polynomial $\omega(x)$, and a process of calculating an erasure locator polynomial $\lambda(x)$ from said erasure locator data $\alpha^i$.

Arithmetic Method

The arithmetic method of this invention calculates the error position polynomial $\sigma(x)$ and the error evaluator polynomial $\omega(x)$ from the updated syndrome polynomial $M(x)$ which is calculated from the erasure locator data $\alpha^i$ indicating the locator of an erasure in the linear cyclic code $R(x)$ and the syndrome polynomial $S(x)$ which is calculated from said erasure locator data $\alpha^i$ and said linear cyclic code $R(x)$, and repeats recursive formulas;

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-i}(x)=1$, $\omega_{-i}(x)=x^{2t}$, $\sigma_0(x)=1$, $\omega_0(x)=M(x)$, until the degree of the polynomial $\omega_i$ becomes equal to or less than $[(d+h-1)/2-1]$ (where [ ] is a Gauss symbol, d is a minimum Hamming distance and h is the number of erasures) to calculate the error position polynomial $\sigma(x)$ and the error evaluator polynomial $\omega(x)$.

BRIEF DESCRIPTION OF THE DRAWINGS

FIG. 3 is a chart showing the format of output data (d=5) of the demodulation part.

DESCRIPTION OF PREFERRED EMBODIMENTS

Figure 1:
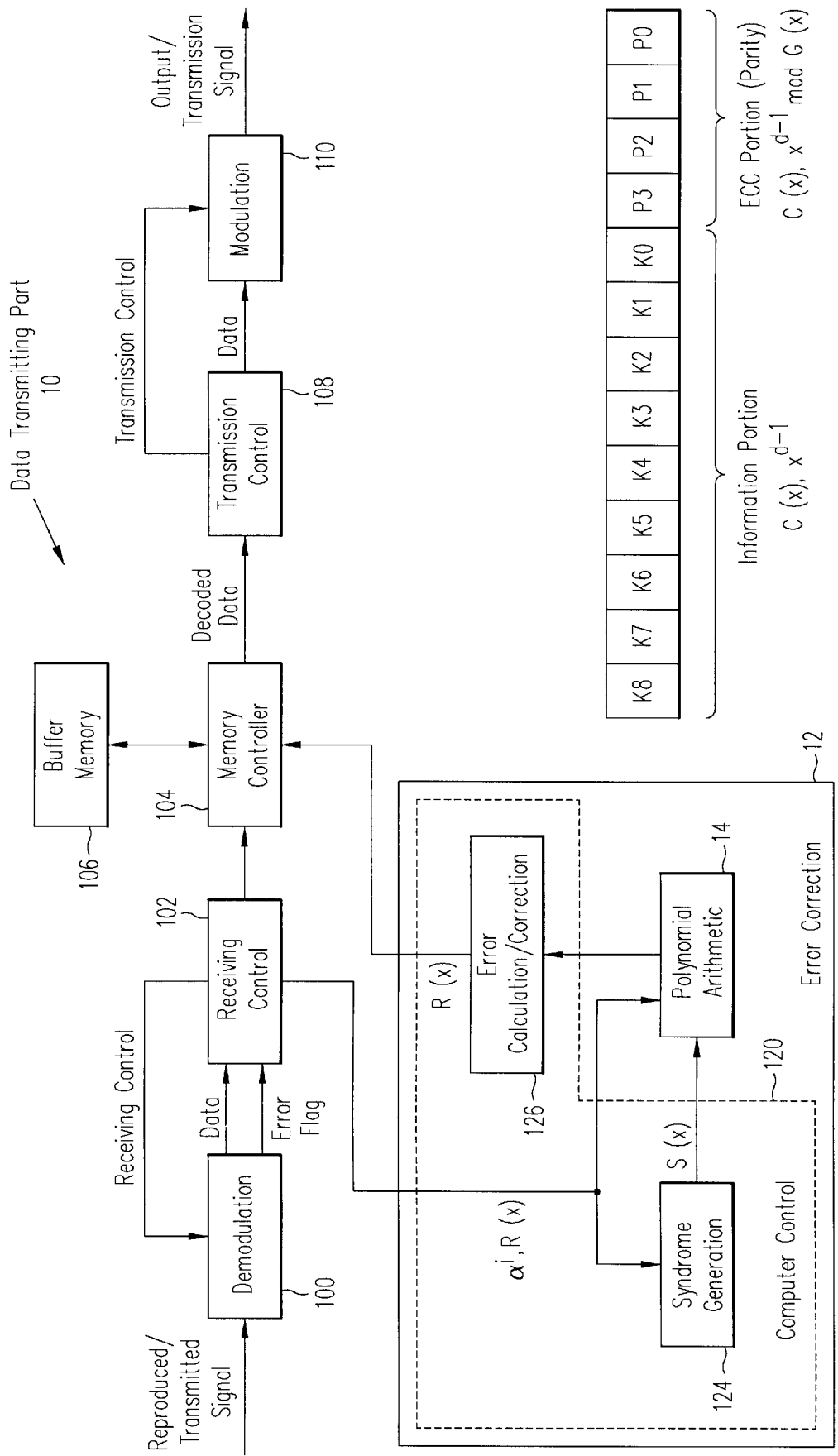
FIG. 1 is a diagram showing the configuration of the decoding apparatus implementing the decoding method of this invention.

First of all, coding and decoding processes according to the Euclidean method are described to facilitate understanding of the decoding method of this invention.

The Euclidean method is used for decoding a linear cyclic code such as a BCH code.

Coding Process

When a generating polynomial G(x) is defined as given in the expression 1 below, with the primitive root of a Galois field GF($2^m$) being α, the bit length of one symbol being m (m=1, 2, 3 ...), the code length n being n≦$2^m$−1, the length k of information being k=n−(d−1), and the minimum Hamming distance being d(=2t+1), a code word C(x) in an RS coding scheme which is defined on the Galois field GF($2^m$) is generated by the following arithmetic operation in the sending side.

$$G(x) = \prod_{i=b}^{b+d-2}(x-\alpha^i) \quad \text{(expression 1)}$$

To simplify the description, a case where the coefficient b in the expression 1 is 0 is described hereunder.

First of all, a check polynomial P(x) given in the expression 3 is obtained from the polynomial I(x) given in the following expression 2 which has a series of information $\{I^{k-1}, I^{k-2}, \ldots, I^0\}$ as coefficients and the generating polynomial G(x) given in the expression 1.

$$I(x) = \sum_{i=b}^{k-1} I_i \cdot x^i \quad \text{(expression 2)}$$

$$P(x) = I(x) \cdot x^{d-1} \bmod G(x) \quad \text{(expression 3)}$$

The code word C(x) is obtained from the polynomial I(x) and check polynomial P(x) given in the expressions 1 and 2 as shown in the following expression 4 and the coefficients of the checking polynomial P(x) given in the expression 3 become the check symbol of the code word C(x).

$$C(x) = I(x) \cdot X^{d-1} + P(x) \quad \text{(expression 4)}$$

where deg P(x)<n−k, deg P(x) is the degree of P(x).

When the codeword C(x) given in the expression 4 is transmitted from the sending side, an error E(x) is added to the code word during the transmission and the code word is received as a received word polynomial R(x) given in the following expression 5 in the receiving side. Each coefficient of the error E(x) is defined as an element on the Galois field GF($2^m$). When an error does not occur during the transmission, E(x)=0.

$$R(x) = C(x) + E(x) \quad \text{(expression 5)}$$

Decoding Process

For decoding the received word polynomial R(x) given in the expression 5, the syndrome polynomial S(x) given in the expression 6 is obtained.

$$S(x) = \sum_{k=0}^{d-2} S_k \cdot x^k \quad \text{(expression 6)}$$

$$\text{where } S_j = \sum_{i=0}^{n-1} R_i(\alpha^j)^i$$

The updated syndrome polynomial M(x) [=S(x)·λ(x) mod $x^{d-1}$; refer to the expression 13] is obtained from the syndrome polynomial S(x) given in the expression 6 using the erasure locator polynomial λ(x).

Further, the error position polynomial σ(x) and the error evaluator polynomial ω(x) given in the expressions 7 and 9 are obtained by solving the updated syndrome M(x) using the algorithm for finding optimal or near optimal solutions of the Euclidean method.

Incidentally, the term "erasure" means that the position of the error in the receiving polynomial is located but the error value is not known.

$$\sigma(x) = \prod_{i=1}^{t}(1+\alpha^{ij}x) = \sum_k \sigma_k x^k \quad \text{(expression 7)}$$

Where ji is the error location.

$$\lambda(x) = \prod_{i}^{h}(1 + \alpha^{ji'}x) = \sum_{k}\lambda_k x^k \qquad \text{(expression 8)}$$

Where ji' is erasure location.

$$\omega(x) = \qquad \text{(expression 9)}$$

$$\lambda(x)\sum_{i=1}^{l} e_i \prod_{ki}^{l}(1 + a^{jk}x) + \sigma(x)\sum_{i=1}^{h} E_i \prod_{hi}^{h}(1 + a^{jk'}x)$$

where $e_i$ is error value, $l$ is number of errors.

$E_i$ is erasure value, $h$ is number of erasures.

When the value $\sigma(\alpha^{-i})$ which is obtained by substituting the error position polynomial $\sigma(x)$ given in the expression 7 with a value $\alpha^{-i}$ is 0 $[\sigma(\alpha^{-i})=0]$, it can be determined that an error occurs in the i-th symbol $R_i$ of the receiving polynomial $R(x)$ and the error value $e_i$ of the symbol $R_i$ is obtained by the arithmetic operation given in the following expression 10.

$$e_i \omega(\alpha^{-i})/\{\alpha^{-i}\sigma'(\alpha^{-i})\cdot\lambda(\alpha^{-i})\} \qquad \text{(expression 10)}$$

When the value $\lambda(\alpha^{-i})$ which is obtained by substituting the erasure locator polynomial $\lambda(x)$ given in the expression 7 with a value $\alpha^i$ is 0 $[\lambda(\alpha^{-i})=0]$, it can be determined that an erasure occurs in the i-th symbol $R_i$ of the receiving polynomial $R(x)$ and the erasure value $E_i$ is obtained by the arithmetic operation given in the following expression 11.

$$E_i = \omega(\alpha^{-i})/\{\alpha^{-i}\cdot\sigma(\alpha^{-i})\cdot\lambda'(\alpha^{-i})\} \qquad \text{(expression 11)}$$

The error value $e_i$ and the erasure value $E_i$ are used for correcting the error and the erasure for the symbol in the error occurring position and the erasure occurring position, that is, the i-th symbol in the received word polynomial $R(x)$ for decode processing.

Embodiment

An embodiment of this invention is now described hereunder.

Decoding Method of this Invention

In the decoding method of this invention, the following expression 12 is solved using the Euclidean method to derive the error evaluator polynomial $\omega(x)$ and the error position polynomial $\sigma(x)$ for decoding a linear cyclic code such as a BCH code in a high speed with a small amount of hardware.

The decoding method is explained mathematically first of all.

$$S(x)\cdot\sigma(x)\cdot\lambda(x)=\omega(x) \bmod x^{d-1} \qquad \text{(expression 12)}$$

The expression 14 is derived by rewriting the expression 12 using the updated syndrome polynomial $M(x)$ of the following expression 13.

$$M(x)=S(x)\cdot\lambda(x) \bmod x^{d-1} \qquad \text{(expression 13)}$$

$$\phi(x)\cdot x^{d-1}+M(x)\sigma(x)=\omega(x) \qquad \text{(expression 14)}$$

As shown in "Code Theory (Hideki Imai, The Institute of Electronic Information Communication, pp. 169–173; reference 5)", for example, the error position polynomial $\sigma(x)$ and the error evaluator polynomial $\omega(x)$ can be uniquely obtained from the expression 14 except for the difference of multiple of a constant to the extent in which $2l+h+1\leq d$ is satisfied (where l is the number of symbols in which errors occur and h is the number of erased symbols).

On the other hand, because the degree deg $\omega(x)$ of the error evaluator polynomial $\omega(x)$ is no greater than $l+h-1$ (deg $\omega(x)\leq l+h-1$) from the expression 9 and the above $(2l+h+1\leq d)$ can be rewritten as $(2l+2h\leq d+h-1)$, the statement that the degree deg $\omega(x)$ of the error evaluator polynomial $\omega(x)$ is no greater than 1 is equivalent to the following expression 15.

$$\deg \omega(x) \leq \left\lfloor \frac{d+h-1}{2} \right\rfloor - 1 \qquad \text{(expression 15)}$$

The following expression 16 is used for solving the expression 14 using the Euclidean method to obtain the error position polynomial $\sigma(x)$ and the error evaluator polynomial $\omega(x)$.

Initial values of the terms of the expression 16 $[A_{-1}(x), B_{-1}(x), R_{-1}(x), A_0(x), B_0(x), R_0(x)]$ are given in the expression 17 and satisfy the expression 16.

The degree deg $R_{-1}(x)$ of the received word polynomial $R_{-1}(x)$ is lower than the degree deg $R_0(x)$ of the received word polynomial $R_0(x)$ [deg $R_{-1}(x)$>deg $R_0(x)$] and the degree of the received word polynomial $R_i(x)$ decreases when the parameter i in the expression 14 increases from -1 to 0. The degree of the received word polynomial $R_i(x)$ decreases similarly as the parameter i increases.

$$A_i(x)x^{2t}+B_{-1}(x)=R_1(x) \qquad \text{(expression 16)}$$

$$A_{-1}(x)=1, B_{-1}(x)=0, R_1(x)=x^{2t}$$

$$A_0(x)=0, B_0(x)=1, R_0(x)=M(x) \qquad \text{(expression 17)}$$

Defining a polynomial $Q_i(x)$ by the recursive formula given in the following expression 18 for solving the error position polynomial $\sigma(x)$ and the error evaluator polynomial $\omega(x)$ in the above condition, polynomials $A_i(x), B_i(x), R_i(x)$ can be expressed by the recursive formula given in the expressions 19 to 21.

$$Q_i(x)=\text{Quotient}[R_{i-2}(x), R_{i-1}(x)] \qquad \text{(expression 18)}$$

where Quotient X, Y are expressed the arithmetic operation which calculate quotient divided X by Y.

$$A_i(x)=A_{i-2}(x)-Q_i(t)\cdot A_{i-1}(x) \qquad \text{(expression 19)}$$

$$B_i(x)=B_{i-2}(x)-Q_i(t)\cdot B_{i-1}(x) \qquad \text{(expression 20)}$$

$$R_i(x)=R_{i-2}(x)-Q_i(t)\cdot R_{i-1}(x) \qquad \text{(expression 21)}$$

When the recursive formulas given in the expressions 18 to 21 are executed repeatedly until the degree deg $R_i(x)$ satisfies the condition of the expression 15, the polynomials $A_i(x), B_i(x), R_i(x)$ become equal to the erasure locator polynomial $\lambda(x)$, the error position polynomial $\sigma(x)$ and the error evaluator polynomial $\omega(x)$ $[A_i(x)=\lambda(x), B_i(x)=\sigma(x), R_i(x)=\omega(x)]$, respectively.

In short, by executing the recursive formulas given in the expressions 18 to 21 repeatedly until the received word polynomial $R_i(x)$ satisfies condition of the expression 15, the error position polynomial $\omega(x)$ and the error evaluator polynomial $\omega(x)$ can be obtained. The following expression 22 shows that the polynomials $A_i(x), B_i(x), R_i(x)$ satisfy the expression 16.

$$A_i(x)x^{2t}+B_i(x)\cdot M(x)=\{A_{i-2}(x)-Q_i(x)\cdot A_{i-1}(x)\}x^{2t}+\{B_{i-2}(x)-$$

$$Q_i(x)\cdot B_{i-1}(x)\}M(x)=\{A_{i-2}(x)\cdot x^{2t}-M(x)\cdot B_{i-2}(x)\}+\{A_{i-1}(x)\cdot$$

$$i\ x^{2t} - M(x) \cdot B_{i-1}(x)\} \cdot Q_i(x) = R_{t-2}(x) - Q_i(x) \cdot R_{i-2}(x) = R_i(x)$$ (expression 22)

Incidentally, the arithmetic operation of the polynomial $A_i(x)$ is not necessary in the actual decode processing as seen from the expressions 18 to 21.

Further, a differential equation σ'(x) is obtained from the error position polynomial σ(x) and a differential equation λ'(x) is obtained from the erasure locator polynomial λ(x).

These polynomials are substituted in the following expressions 23, 24 (equivalent to the expressions 10, 11) to derive the error value $e_i$ and the erasure value $E_i$.

The derived error value $e_i$ and erasure value $E_i$ are the difference between the error symbol and the correct symbol.

By taking a logical OR between the error symbol in the received word polynomial R(x) and the error value $e_i$ or the erasure value $E_i$, the error symbol is corrected to a correct symbol.

$$e_i = \omega(\alpha^{-ji})/\{\alpha^{-ji} \cdot \sigma'(\alpha^{-ji}) \cdot \lambda(\alpha^{-ji})\}$$ (expression 23)

$$E_i \omega(\alpha^{-ji})/\{\alpha^{-ji} \cdot \sigma)(\alpha^{-ji}) \cdot \lambda(\alpha^{-ji})\}$$ (expression 24)

Because a method of algebraically solving a polynomial of an arbitrary degree (algebraic polynomial of a single variable) on the Galois field GF ($2^m$) is not known, the polynomial is solved by a method called a chein search to determine whether or not an element on the Galois field GF ($2^m$) is a solution of the algebraic equation for all the element thereof. The Chein search is not done for the area of the Galois field GF ($2^m$) where a solution of the polynomial can not exist.

Further, it can be determined that a correction is impossible when the degree of the polynomial does not match the number of the solutions of the polynomial.

Decoding Apparatus 1

The decoding apparatus 1 which implements the decoding method so far described is now described hereunder.

FIG. 1 is a diagram showing the configuration of the decoding apparatus 1 implementing the decoding method of this invention.

As shown in FIG. 1, the decoding apparatus 1 comprises a data transmission part 10 and an error correction part 12.

The data transmission part 10 comprises a demodulation part 100, a receiving control part 102, a memory controller part 104, a buffer memory part 106, a transmission control part 108 and a modulation part 110.

An error correction part 12 comprises a computer control part 120 and a polynomial arithmetic part 14.

The computer control part 120 comprises a syndrome generating part 124 and an error calculation/correction part 126.

Figure 2:
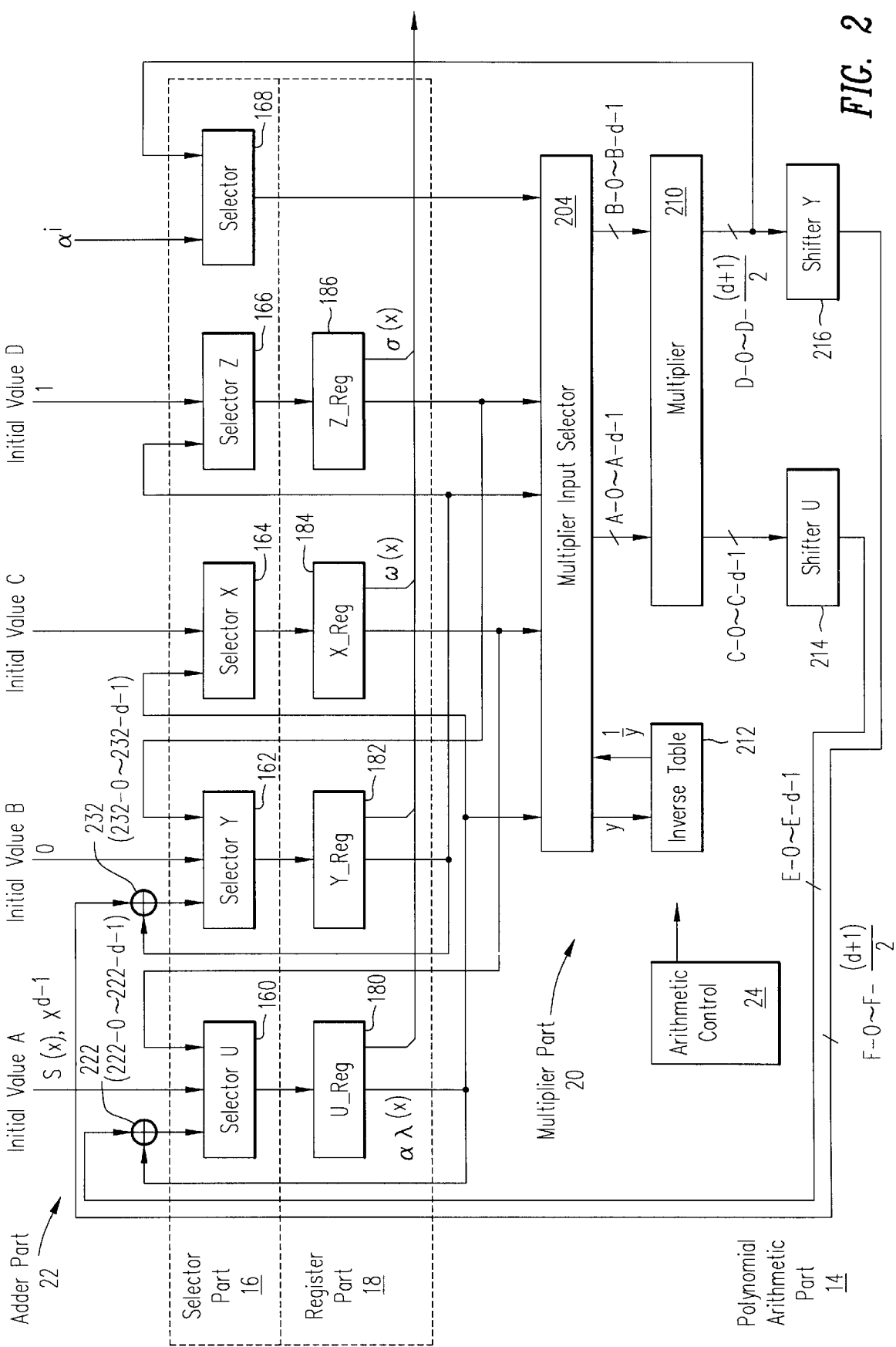
FIG. 2 is a diagram showing the configuration of the polynomial arithmetic part shown in FIG. 1

FIG. 2 is a diagram showing the configuration of the polynomial arithmetic part 14 shown in FIG. 1.

The polynomial arithmetic part 14 comprises a selector part 16, a register part 18, a multiplier part 20, an adder part 22 and an arithmetic control part 24.

The selector part 16 comprises 5 selectors including a selector U 160, a selector Y 162, a selector X 164, a selector Z 166 and a selector 168.

The register part 18 comprises 4 registers including a register U (U_reg) 180, a register Y (Y_reg) 182, a register X (X_reg) 184 and a register Z (Z_reg) 186.

The multiplier part 20 comprises a multiplier input selector 204, a multiplier 210, an inverse table 21, a shifter U 214 and a shifter 216.

The adder part 22 comprises adders 222 and 232.

The decoding apparatus 1 is used in a data recording and reproducing device for recording and reproducing data for data transmission device for transmitting data using a linear cyclic code such as an RS code, or in recording media such as a hard disk and a magneto-optical disk for recording/reproducing data, for example.

With these components, the decoding apparatus 1 corrects (decodes) an error and an erasure included in the received or reproduced data (received word) and further transmits and outputs it.

Demodulation Part 100 In the transmission part 10 (FIG. 1), the demodulation part 100 operates under the control of the receiving control part 102 to demodulate a transmission signal or a reproduced signal received by the data transmission device or the data recording/reproducing device (not shown) including the decoding apparatus 1 and outputs the digital data obtained as a result of demodulation to the receiving control part 102 as a received word (received word polynomial R(x)).

The demodulation part 100 detects an error upon demodulation and generates an error flag indicating the position of an erroneously demodulated symbol for output to the receiving control part 102. The error flag indicates the position of an erased symbol (erasure locator) in the received word polynomial R(x) and corresponds to the value $\alpha^i$ in the preceding description.

FIG. 3 is a chart showing a format of output data (d=5) of the demodulation part 100.

The received word polynomial R(x) outputted from the demodulation part 100 includes an information portion $[C(x) \cdot x^{d-1}]$ of 9 symbols and an ECC portion of 4 symbols when d=5 as shown in FIG. 3 and can be expressed as given in the following expression 25.

$$R(x) = K8 \cdot x^{12} + k7x^{11} + \ldots + K0 \cdot x^4 P3 \cdot x^3 + P2 \cdot x^2 + \ldots + P0 \cdot x^0$$ (expression 25)

The received word polynomial R(x) outputted by the demodulation part 100 may be one which can be evenly divided by the generating polynomial G(x) given in the expression 1 when an erasure or an error does not occur without being limited to the form shown in FIG. 3.

Receiving Control Part 102

The receiving control part 102 controls the decode processing of the demodulation part 100.

The receiving control part 102 also outputs the received word polynomial R(x) inputted from the demodulation part 100 to the syndrome generating part 124 of the receiving control part 102, the polynomial arithmetic part 14 and the computer control part 120.

The receiving control part 102 also generates erasure locator data ($\alpha^i$) indicating the erasure locator in the received word polynomial R(x) based on the error flag inputted from the demodulation part 100 and outputs it to the syndrome generating part 124 and the polynomial arithmetic part 14 of the computer control part 120.

Memory Control Part 104

The memory control part 104 controls the memory operation of the buffer memory 106 to store therein the received word polynomial R(x) inputted from the receiving control part 102.

The memory control part 104 also correct s a symbol in which an error or an erasure occurs. Specifically, the memory control part 104 corrects a symbol among those stored in the buffer memory part 106 which is indicated by the correction position data $i[\sigma(\alpha^i)]$ inputted from the error calculation/correction part 126 of the computer control part 120 using the error value $e_i$ or the erasure value $E_i$ inputted from the error calculation/correction part 126.

The memory control part 104 also reads out the corrected received word polynomial R(x) (decoded data) from the buffer memory 106 to output it to the transmission part 108.

Transmission Control Part 108

The transmission control part 108 controls the communication with a communicating party.

The transmission control part 108 also controls modulation processing of the modulation part 110.

The transmission control part 108 also outputs decoded data outputted from the memory control part 104 to the modulation part 110.

Modulation Part 110

The modulation part 110 operates under the control of the transmission control part 108 to modulate decoded data inputted from the transmission control part 108 and output it to an external information/communication equipment (not shown) as an output signal or a transmission signal.

Incidentally, the modulation part 110 is not needed when the decoding apparatus 1 outputs data directly to the external equipment without intervening a communication line.

Syndrome Generating Part 124

The syndrome generating part 124 obtains the syndrome polynomial $S(x)$ [=$s_0, s_1, \ldots, s_{d-2}$] given in the expression 6 using the received word polynomial $R(x)$ and the radix [$\alpha^i$] of the generating polynomial inputted from the receiving control part 102 and outputs it to the polynomial arithmetic part 14.

Error Calculation/Correction Part 126

The error calculation/correction part 126 calculates the correction position data $i[(\sigma(\alpha^i)]$ and the error value $e_i$ or the erasure value $E_i$ (expression 23, 24) based on the polynomials $\sigma(x)$, $\omega(x)$, $\lambda(x)$ inputted from the polynomial arithmetic part 14 and the erasure locator data $\alpha^i$.

The error calculation/correction part 126 also outputs the calculated correction position data $i[\sigma(\alpha^i)]$ and the error value $e_i$ or the erasure value $E_i$ to the memory control part 104 to have it correct the symbol in the received word in which an error or erasure occurs (error/erasure symbol).

Polynomial Arithmetic Part 14

The polynomial arithmetic part 14 solves the recursive formula given in the expressions 18 to 21 using the syndrome polynomial $S(x)$ inputted from the syndrome generating part 124 and the erasure locator data $\alpha^i$ to obtain the erasure locator polynomials $\sigma(x)$, the error position polynomial $\omega(x)$, and the error evaluator polynomial $\lambda(x)$ for output to the error calculation/correction part 126.

Selector 160

In the selector part 16 (FIG. 2), the selector 160 operates under the control of the arithmetic control part 24 and selects either one of data inputted from the adder 222 (adder circuits 222-0~222-d-1) (the result of addition), data inputted from the register X_reg 184 and the syndrome polynomial $S(x)$ or a coefficient $x^{d-1}$ (initial value A) inputted from the syndrome generating part 124 to output it to the register U_reg 180.

Selector Y 162

The selector Y 162 operates under the control of the arithmetic control part 24 and selects either one of data inputted from the register Z_reg 186, data inputted from the adder 232 (adder circuits 232-0~232-d-1) (the result of addition), and a value 0 (initial value B) to output it to the register Y_reg 182.

Selector X 164

The selector X 164 operates under the control of the arithmetic control part 24 and selects either one of data inputted from the register U_reg 180 and an initial value C to output it to the register X_reg 184.

Selector Z 166

The selector Z 166 selects either one of data outputted from the register Y_reg 182 and a value 1 (initial value D) to output it to the register Z_reg 186.

Selector 168

The selector 168 selects either one of data input from the multiplier 216 (the result of multiplication D-0~D-d-1) and the erasure locator data $\alpha^i$ input from the receiving control part 102 to output it to a multiplier input selector 204.

Register U_reg 180

In the register part 18, the register U_reg 180 includes (d-1) registers of a data width k and operates under the control of the arithmetic control part 24 to hold data input from the selector U 160 and output it to the adder 222 (adder circuits 222-0~222-d-1), the selector X 164 and the multiplier input selector 204.

The register U_reg 180 also holds the erasure locator polynomial $\lambda(x)$ which is obtained as a result of the arithmetic operation to be described later with reference to FIG. 12.

Register Y_reg 182

The register Y_reg 182 includes (d+1)/2 registers of a data width k and operates under the control of the arithmetic control part 24 to hold data input from the selector Y 162 and output it to the adder 232 (adder circuits 232-0~232-d-1), the multiplier input selector 204 and the selector Z 166.

Resister X_reg 184

The register X_reg 184 includes (d-1) registers of a data width k and operates under the control of the arithmetic control part 24 to hold data input from the selector X 164.

The register X_reg 184 also outputs the error evaluator polynomial $\omega(x)$ obtained as a result of processing to the error calculation/correction part 126.

Register Z_reg 186

The register Z_reg 186 includes (d+1)/2 registers of a data width k and operates under the control of the arithmetic control part 24 to hold data input from the selector Z 166 and output it to the selector Y 162 and the multiplier input selector 204.

The register Z_reg 186 also outputs the error evaluator polynomial $\omega(x)$ obtained as a result of arithmetic operation to be described later with reference to FIG. 12.

Incidentally, it is enough for the registers included in the polynomial arithmetic part 14 to be k×(3d-1) bits in total and this is less than the conventional scheme.

Multiplier Input Selector 204

The multiplier input selector 204 operates under the control of the arithmetic control part 24 and selects 2 out of the data input from the receiving control part 102, the register X_reg 184, the register Z_reg 186, and the register 168.

The multiplier input selector 204 also selects the portion of the 2 selected data items which is processed in the multiplier 210 to generate input data A0~A-d-1, B-0~B-d-1 for output to the multiplier 210.

Inverse Table 212

The inverse table 212 stores a coefficient input from the multiplier input selector 204 and the inverse thereof in correlation to each other and outputs the inverse of the coefficient (1/y) of input data from the multiplier 210 to the multiplier 210 when the input data is input from the multiplier 210.

Specifically, when input data A-0~A-d-1 is input from the multiplier input selector 204, the inverse 1/(A-0)~1/(A-d-1) thereof are returned to the multiplier input selector, or when input data B-0~B-d-1 is input from the multiplier input selector 204, the inverse 1/(B-0)~1/(B-d-1) thereof are returned to the multiplier input selector.

The inverse table 212 is used when the multiplier 210 performs a division as described later.

Multiplier 210

The multiplier 210 operates under the control of the arithmetic control part 24 and multiplies 2 sets of input data selected by the multiplier input selector 204 (A-0~A-d−1, B-0~B-d−1 or the inverse thereof; the data width of each input data being k bits) each other and outputs the d results of multiplication C-0~C-d−1 [=(A-0)·(B-0)~(A-d−1)·(B-d−1)] of k bits of data width to the shifter U 214.

The multiplier 210 also multiplies input data items each other and outputs (d+1)/2 multiplication results D-0~D-(d+1)/2 of k bits of data width to the shifter Y 216 as the result of multiplication D-0~D-(d+1)/2.

Shifter U 214

The shifter U 214 operates under the control of the arithmetic control part 24 and shifts the results of multiplication C-0~C-d−1 input from the multiplier 210 to generate data E-0~E-d−1 for output it to the adder circuits 222-0~222-d−1 of the adder 222, respectively.

Shifter Y 216

The shifter Y 216 operates under the control of the arithmetic control part 24 and shifts the results of multiplication D-0~D-d−1 input from the multiplier 210 to generate data F-0~F-(d+1)/2 for output it to the adder circuits 232-0~232-(d+1)/2 of the adder 232, respectively.

Adder 222

In the adder part 22, the adder 222 comprises d adder circuits 222-0~222-d−1 (not shown) each of which adds 2 data items of k bits width each other to output the result of addition of k bits data width, and adds data input from the shifter U 214 E-0~E-d−1 to data input from the register U_reg 180 for output to the selector U 160.

Adder 232

The adder 232 comprises (d+1)/2 adder circuits 232-0~232-(d+1)/2 (not shown) each of which adds 2 data items of k bits width each other to output the result of addition of k bits data width, and adds data F-0~F-(d+1)/2 input from the shifter Y 214 to data input from the register Y_reg 182 for output to the selector Y 162.

Arithmetic Control Part 24

The arithmetic control part 24 provides an arithmetic control of the polynomial arithmetic part 14. Specifically, the arithmetic control part 24 controls the operation of the components of the selector part 16, the multiplier part 20, the adder part 22 and the register part 18 to derive the polynomials ω(x), λ(x), σ(x) from the syndrome polynomial S(x) input from the syndrome generating part 124 and the erasure locator data $\alpha^i$.

The arithmetic control by the polynomial arithmetic part 24 is now described hereunder.

In the polynomial arithmetic part 14, 2 arithmetic operations shown in the following table 1 are performed.

Table 1

Arithmetic operation performed in the polynomial arithmetic part 14

1. Arithmetic operation to obtain updated syndrome S(x)·λ(x) mod $x^{d-1}$
   [=M(x); Expression 13](arithmetic operation 1)

2. Arithmetic operation to obtain
   the error position polynomial σ(x)[expression 7],
   the error evaluator polynomial ω(x)[expression 9], and
   the erasure locator polynomial λ(x)[expression 8]
   (arithmetic operation 2)

Arithmetic Operation to obtain M(x) (Arithmetic Operation 1)

The updated syndrome M(x) is obtained by controlling the components of the polynomial arithmetic part 14 to cause the arithmetic control part 24 to substitute the expression 13 with the erasure locator data $\alpha^i$ which is input from the receiving control part 102 as the error position polynomial λ(x) and the syndrome polynomial S(x) which is input from the syndrome generating part 124 and is held in the register U_reg 180 (FIG. 2).

In other words, the updated syndrome M(x) can be calculated by multiplying the erasure locator data $\alpha^i$ with the syndrome polynomial S(x) as shown in the following expression 26 and extracting the result of multiplication from the constant term to the $X^{d-1}$ term.

$$M(x) = S(x)\prod_j (1 + a^{ij} \cdot x) \bmod x^{d-1} \qquad \text{(expression 26)}$$

The actual operation 1 is performed as shown in the following first to the h-th steps by utilizing the fact that the updated syndrome S(x) can be expanded as shown in the following expression 27.

For the purpose of simplifying the description, a case where d=11 is taken hereunder as a specific example.

$$M(x)=(1+x\cdot 60^{\ i1})\cdot(1+x\cdot \alpha^{i2})\cdot \ldots \cdot (1+x\cdot \alpha^{ih})\cdot S(x) \bmod x^{d-1} \qquad \text{(expression 27)}$$

(First Step)

Figure 4:
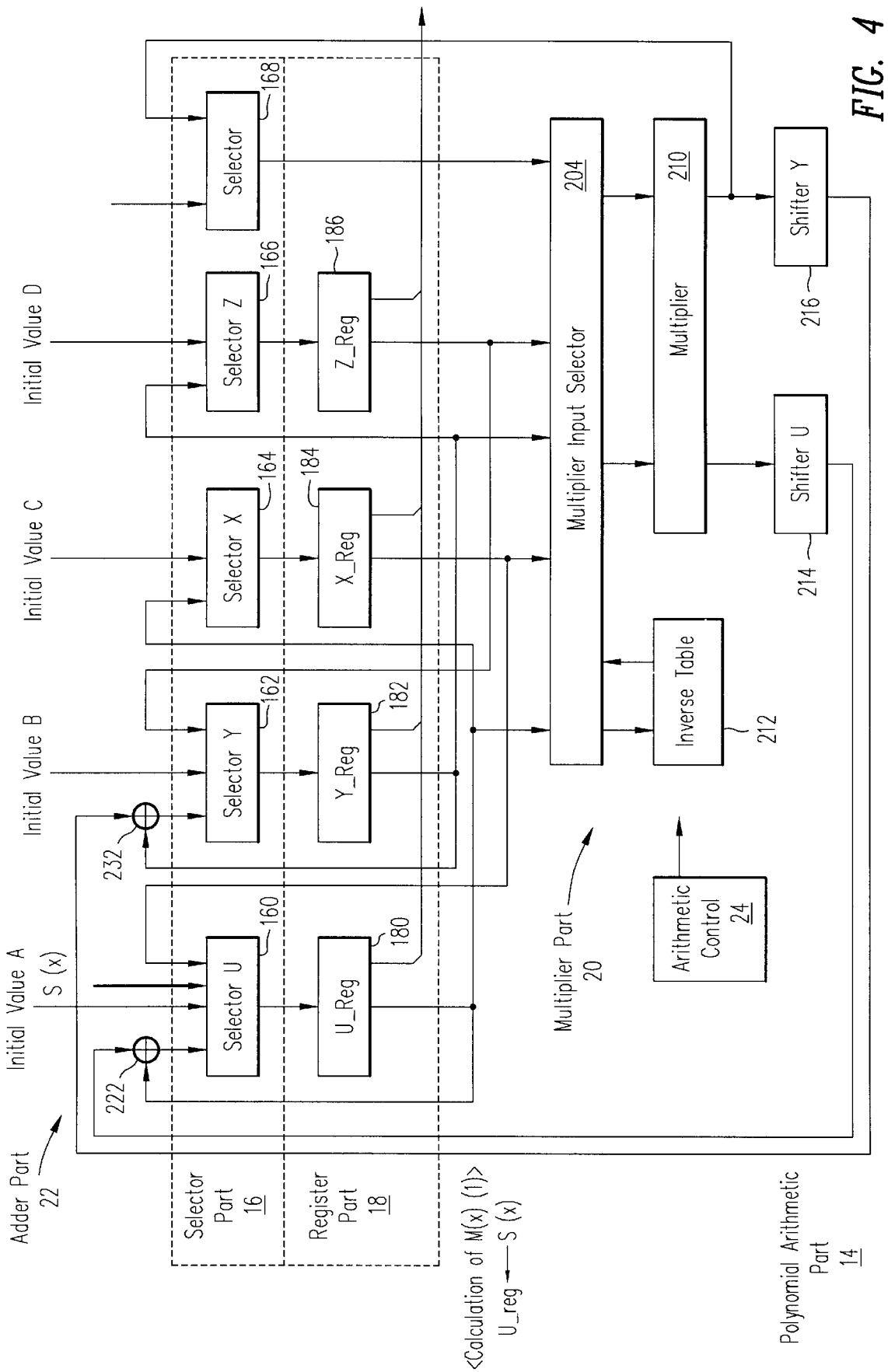
FIG. 4 is the first diagram showing the first operation in which the polynomial arithmetic part shown in FIGS. 1 and 2 calculates the updated syndrome M(x).

FIG. 4 is a diagram showing the first arithmetic operation in which the polynomial arithmetic part 14 shown in FIGS. 1 and 2 calculates the updated syndrome M(x).

In the first step, the arithmetic control part 24 controls the components of the polynomial arithmetic part 14 to cause the 0-th to 9th terms of the syndrome polynomial S(x) which are input from the syndrome generating part 124 to be held in the 0th to the 9th registers of the register U_reg 180, and the arithmetic operation shown in the following expression 28 is applied to the so held syndrome polynomial S(x), the erasure locator data $\alpha^i$ input from the receiving control part 102 and a coefficient x of the symbol included in the received word polynomial R(x).

$$M_1(x)=(1+x\cdot \alpha^{i1})\cdot S(x) \bmod x^{10} \qquad \text{(expression 28)}$$

Figure 5:
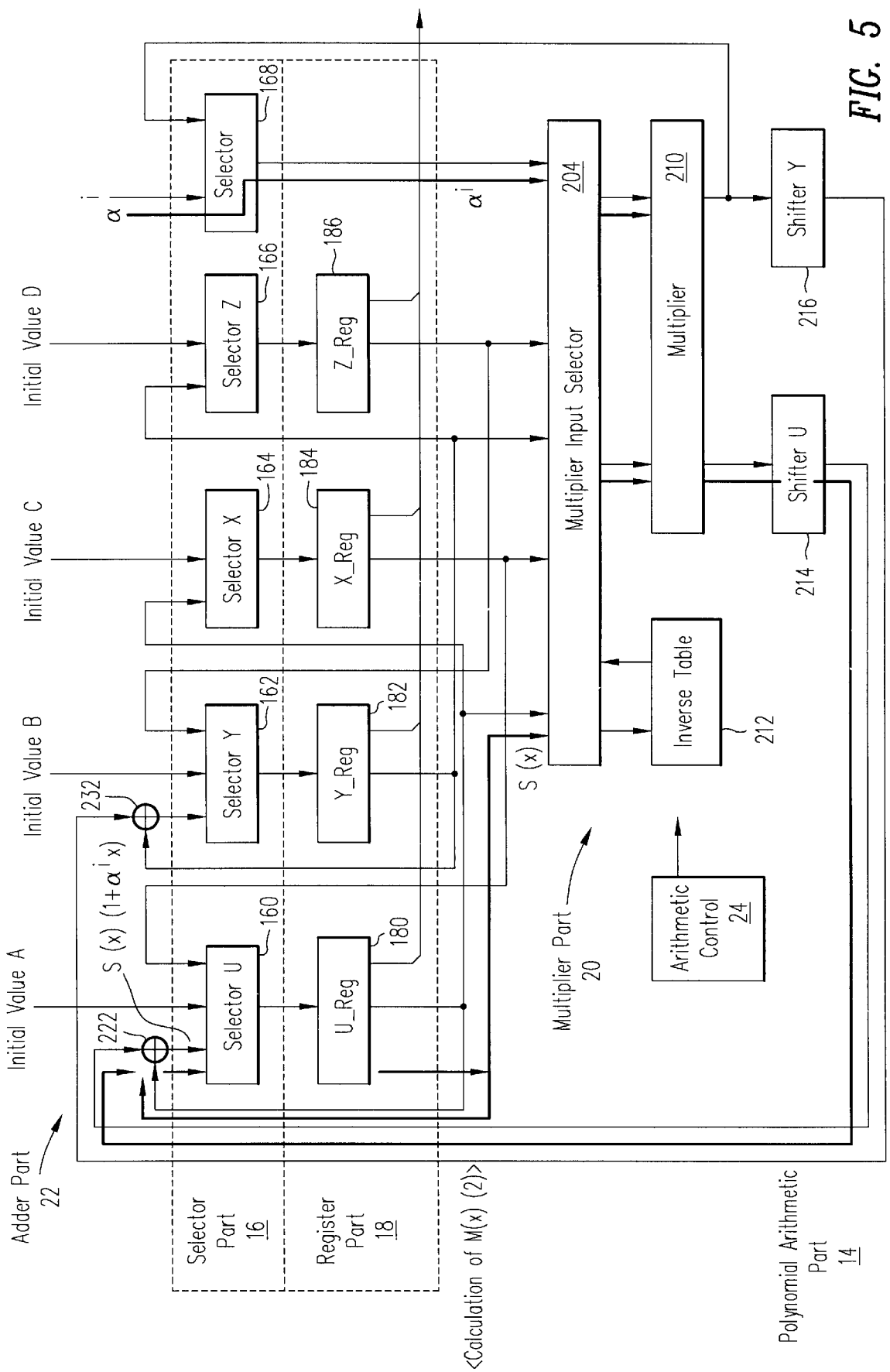
FIG. 5 is a diagram showing the second arithmetic operation in which the polynomial arithmetic part shown in FIGS. 1 and 2 calculates the updated syndrome M(x).

FIG. 5 is a diagram showing the second arithmetic operation in which the polynomial arithmetic part 14 shown in FIGS. 1 and 2 calculates the updated syndrome M(x).

Actually, the arithmetic control part 24 causes the arithmetic operation shown in the following expression 29 to be performed using the syndrome polynomial S(x), the erasure locator data $\alpha^{i1}$ and the received word polynomial R(x) z and causes the result of the arithmetic operation to be held in the register U_reg 180.

$$S(x)+(\alpha^{ij})\cdot S(x)\cdot x \qquad \text{(expression 29)}$$

When d=11, because the highest degree of the syndrome polynomial S(x) is 9, the 0th to the 10th degrees terms are included in the result of the arithmetic operation of the expression 29 but only the 0th to the 9th terms among them are held in the register U_reg 180 with the 10th term not held therein because it includes 10 registers.

Accordingly, when the arithmetic operation of the expression 29 is performed using the register U_reg 180, the arithmetic result shown in the following expression 30 will be held in the r-th register included in the register U_reg 180.

$$S_r=S_r+\alpha^{ij}\cdot S_{r-1} \qquad \text{(expression 30)}$$

where $S_r$ is the value held in the r-th register of U_reg 180.

(The Second to the (h−1)th Steps)

In the second to the (h−1)th steps, the arithmetic control part 24 controls the components of the polynomial arithmetic part 14 to cause the similar arithmetic operation to the first step to be performed as shown in the following expression 31 successively using the erasure locator data $\alpha^{i2} \sim \alpha^{ih-1}$.

$$M_2(x) = (1 + x \cdot \alpha^{i2}) \cdot M_1(x) \bmod x^{10} \quad \text{(expression 31)}$$
$$\vdots$$
$$M_{h-1}(x) = (1 + x \cdot \alpha^{ih-1}) \cdot M_{h-2}(x) \bmod x^{10}$$

(The h-th Step)

In the h-th step, the arithmetic control part 24 controls the components of the polynomial arithmetic part 14 to cause the similar arithmetic operation to the first step shown in the following expression 32 to be performed to calculate the updated syndrome M(x).

By the arithmetic operation so far described, the updated syndrome M(x) is derived and held in the register U_reg 180.

$$M(x) = (1 + x^h) \cdot M_{h-1}(x) \bmod x^{10} \quad \text{(expression 32)}$$

Arithmetic Operation to Obtain σ(x), ω(x), λ(x) (Arithmetic Operation 2)

The error position polynomial σ(x) and the error evaluator polynomial ω(x) are obtained by the following procedure.

Register Setting

Figure 6:
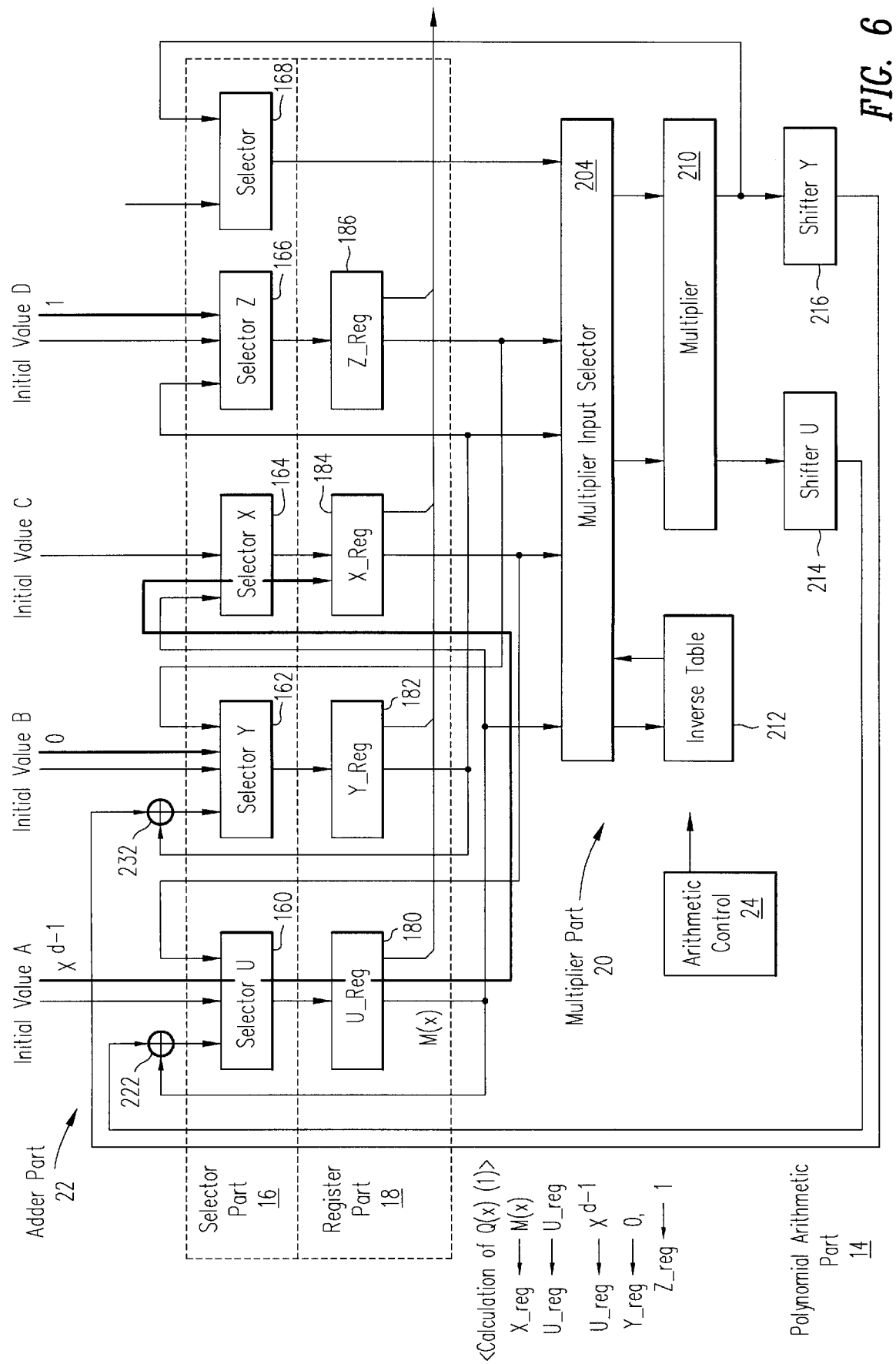
FIG. 6 is a diagram showing the first arithmetic operation in which the polynomial arithmetic part shown in FIGS. 1 and 2 calculates a quotient Q(x).

FIG. 6 is a diagram showing the first arithmetic operation (register setting) in which the polynomial arithmetic part 14 shown in FIGS. 1 and 2 calculates the quotient Q(x).

The arithmetic control part 24 sets up the register U_reg 180, the register Y_reg 182, the register X_reg 184 and the register Z_reg 186 as shown in FIG. 6.

Specifically, the arithmetic control part 24 causes the updated syndrome M(x) calculated by the above arithmetic operation and held in the register U_reg 180 to be held in the register X_reg 184 via the selector X 164.

The arithmetic control part 24 causes a coefficient $x^{d-1}$ (actually, the value is 1) in the received word polynomial R(x) input from the receiving control part 102 to be held in the register U_reg 180 as an initial value A via the selector U 160.

The arithmetic control part 24 also causes an initial value B (a value 0) to be held in the register Y_reg 182 via the selector Y 162 and an initial value D (the constant term of the polynomial λ(x)=1) to be held in the register X_reg 186 via the selector Z 166.

Arithmetic Operation Obtaining σ(x), ω(x), λ(x) (Arithmetic Operation 2)

The error position polynomial σ(x), the error evaluator polynomial ω(x) and the erasure locator polynomial λ(x) are derived by solving the recursive formulas given in the expressions 18 to 21 by repeating calculation of the quotient Q(x) given below, followed by exchange of the polynomial (Ureg) held in the register U_reg 180 with polynomial (Xreg) held in the register X_reg 184 and exchange of the polynomial (Yreg) held in the register Y_reg 182 with polynomial (Zreg) held in the register Z_reg 186 (exchange of polynomials) until the degree of the polynomial held in the register X_reg 184 (deg Xreg) becomes smaller than a value [(d−1+h)/2] (where [x] is a Gausian symbol which is a maximum integer not exceeding x).

By such arithmetic operation, the error position polynomial σ(x), the error evaluator polynomial ω(x) and the erasure locator polynomial λ(x) are derived and held in the registers Z_reg 186, Y_reg 182 and U_reg 180, respectively, for output to the error calculation/correction part 126.

Calculation of Q(x)

Figure 7:
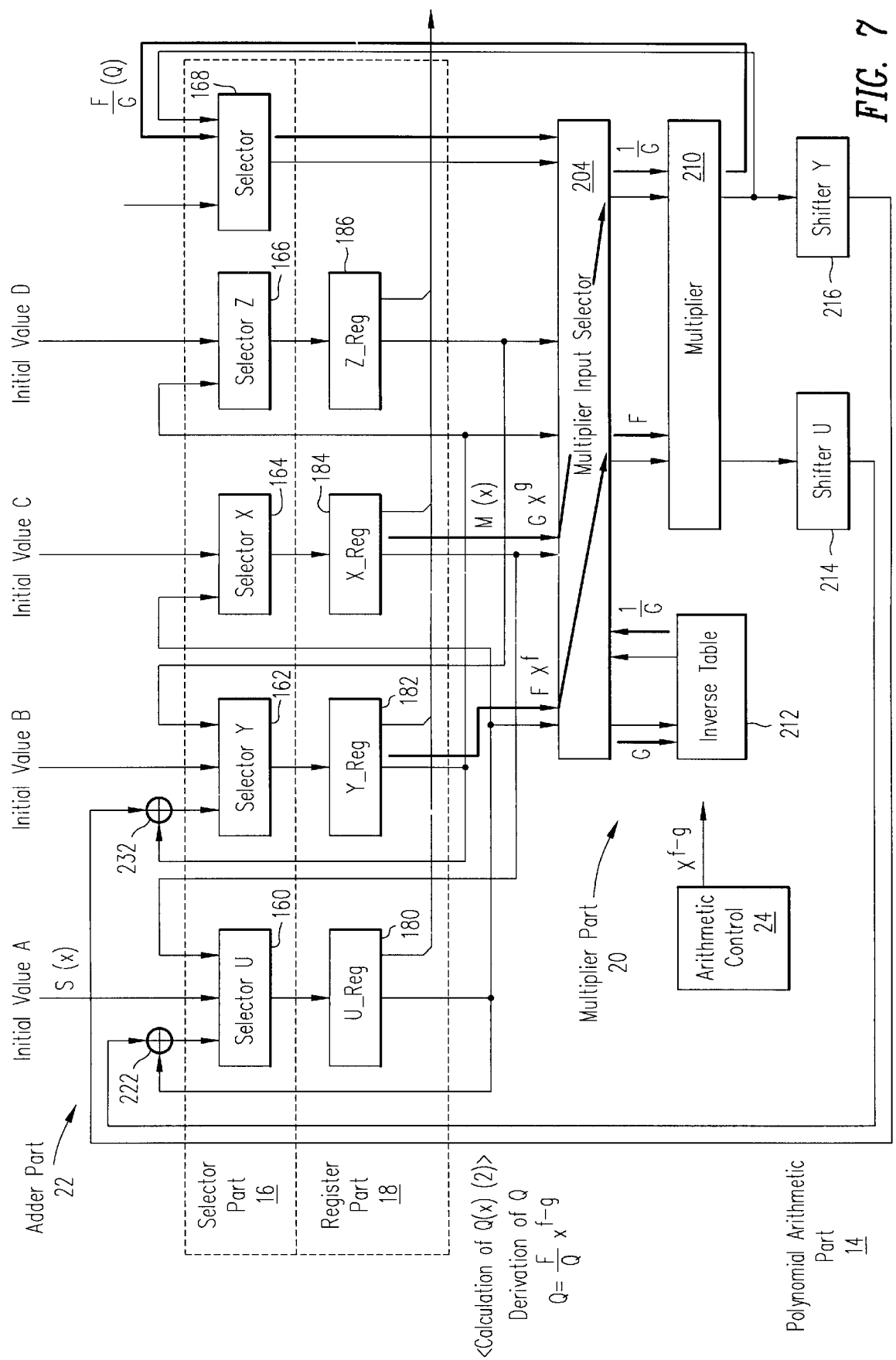
FIG. 7 is a diagram showing the second arithmetic the operation (calculation of the arithmetic result Q) in which the polynomial arithmetic part shown in FIGS. 1 and 2 calculates the quotient Q(x).

FIG. 7 is a diagram showing the second arithmetic operation (calculation of the result Q) in which the polynomial arithmetic part 14 shown in FIGS. 1 and 2 calculates the quotient Q(x).

The arithmetic control part 24 then calculates the quotient Q(x) derived from a division of the coefficient $x^{d-1}$ held in the register U_reg 180 by the updated syndrome M(x) held in the register X_reg 184.

The quotient Q(x) is calculated by repeating the following first to the third steps until the degree of the polynomial held in the register U_reg 180 becomes smaller than the degree of the polynomial held in the register X_reg 184.

In the first step, the arithmetic control part 24 controls the components of the polynomial arithmetic part 14 according to the procedure shown below to obtain the arithmetic result Q.

The arithmetic control part 24 controls the multiplier input selector 204 to cause it to output the coefficient of the term of the highest degree (the highest degree term) in the polynomial held in the register U_reg 180 and the coefficient of the term of the highest degree in the polynomial held in the register X_reg 184 to the multiplier 210 as input data A-0 and B-0, respectively (it is arbitrary which of the coefficients is chosen as A-0 or B-0).

For example, when the polynomial held in the register U_reg 180 is $(F \cdot x^f + \ldots)$ while the polynomial held in the register X_reg 184 is $(G \leftrightarrows x^g + \ldots)$, the multiplier input selector 204 outputs the coefficient F as the input data A-0.

The multiplier input selector 204 also obtains the inverse 1/G of the coefficient G input from the register X_reg 184 to output it to the multiplier 210.

The multiplier 210 multiplies the input data A-0 and B-0 input from the multiplier input selector each other to obtain the arithmetic result Q (=F/G) under the control of the arithmetic control 24.

Specifically, the multiplier 210 divides the coefficient (F) of the highest degree term of the polynomial held in the register U_reg 180 by the coefficient (G) of the highest degree term of the polynomial held in the register X_reg 184 to obtain the arithmetic result Q (F/G) under the control of the arithmetic control 24 and outputs it to the selector 168 as data D-0.

The selector 168 outputs the arithmetic result Q input from the multiplier 210 to the multiplier input selector 204 under the control of the arithmetic control part 24.

(The Second Step)

Figure 8:
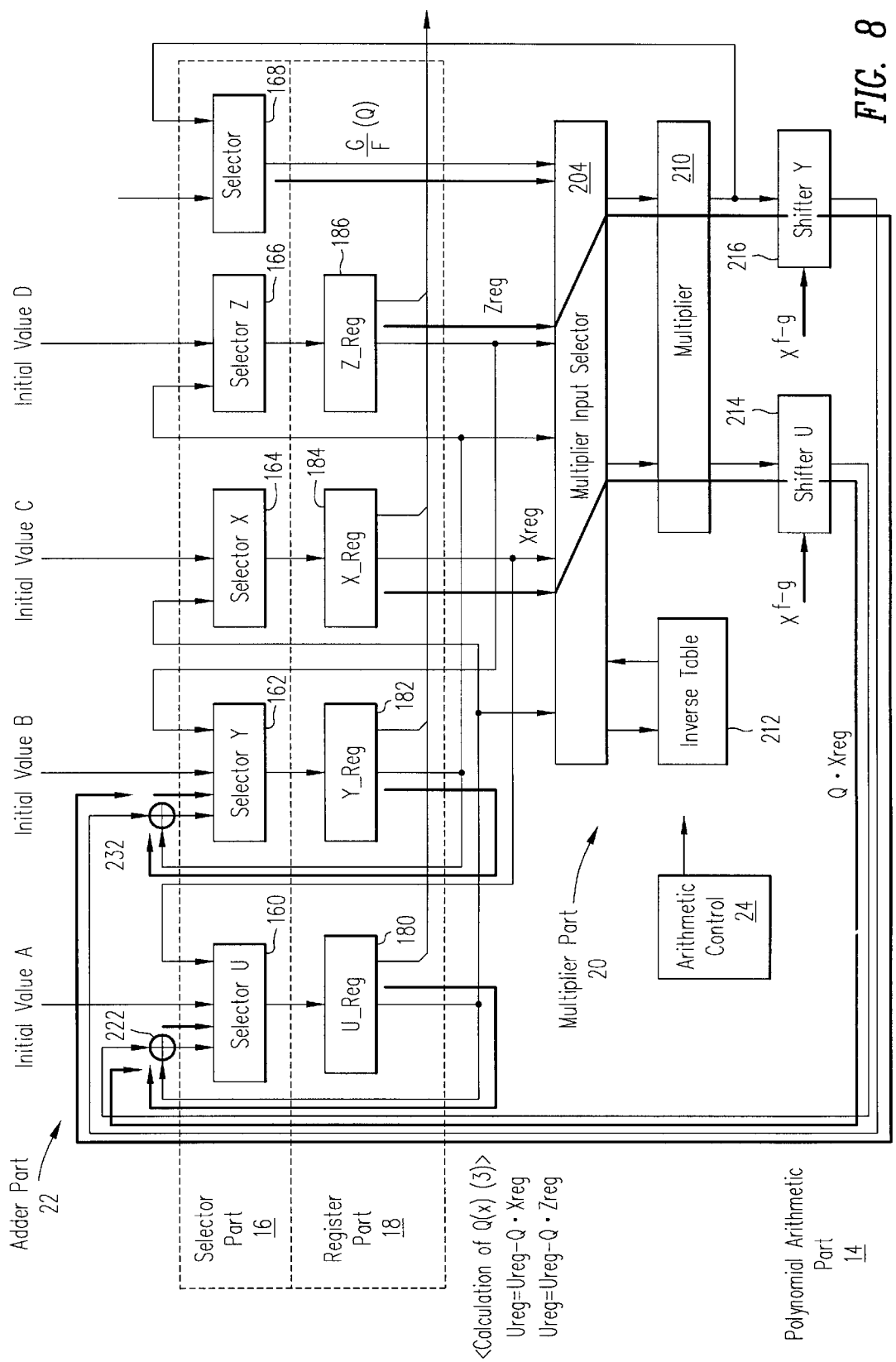
FIG. 8 is a diagram showing the third arithmetic operation in which the polynomial arithmetic part shown in FIGS. 1 and 2 calculates the quotient Q(x).

FIG. 8 is a diagram showing the third arithmetic operation in which the polynomial arithmetic part 14 shown in FIGS. 1 and 2 calculates the quotient Q(x).

The arithmetic control part 24 controls the multiplier input selector 204 to cause it to output the polynomial (Xreg) held in the register X_reg 184 and the arithmetic result Q obtained in the above step 1 to the multiplier 214.

The multiplier 210 multiplies these input data and outputs the result of the multiplication (Q·Xreg) to the shifter U 214.

The shifter U 214 shifts the result of the multiplication under the control of the arithmetic control 24 and outputs it to the adder 222 (adder circuits 222-1~222-d−1) as a coefficient $x^{f-g}$.

The adder 222 (adder circuits 222-1~222-d−1) adds the data input from the multiplier 210 to the data input from the register U_reg 180 and outputs the arithmetic result to the selector 160.

In the adder 222 (adder circuits 222-1~222-d-1), the result of adding the multiplication result (Q·Xreg) and the polynomial (Ureg) is equal to the result of subtracting the multiplication result (Q·Xreg) from the polynomial (Ureg) [Ureg–Q·Xreg] because the index of the Galois field ($2^m$) is 2 and addition is equivalent to subtraction.

The arithmetic control part 24 controls the selector 160 and he register U_reg 180 to cause the result of subtraction input rom the adder 222 (adder circuits 222-1~222-d-1) to be held in the register U_reg 180 (Ureg=Ureg–Q·Xreg)

(The Third Step)

The arithmetic control part 24 controls the multiplier input selector 204 to cause it to output the polynomial (Zreg) held in the register Z_reg 186 and the arithmetic result Q obtained in the above step 1 to the multiplier 210.

The multiplier 210 multiplies these input data and outputs the coefficients of the polynomial obtained as a multiplication result to the shifter Y 216.

The shifter Y shifts the multiplication result input from the multiplier 210 under the control of the arithmetic control part 24 to output to the adder 232 (adder circuits 232-1~232-(d–1)/2) as a coefficient $x^{f-g}$.

The adder 232 (adder circuits 232-1~232-(d+1)/2 ) adds the data input from the multiplier 210 to the data input from the register Y_reg 182 to output the result to the selector Y 162.

In the adder 232 (adder circuits 232-1~232-(d+1)/2), the result of adding the multiplication result (Q·Xreg) to the polynomial (Zreg) is equal to the result of subtracting the multiplication result (Q·Xreg) from the polynomial (Zreg) [Q·Xreg–Zreg].

The arithmetic control part 24 causes the result of the subtraction input from the adder 232 (adder circuits 232-1~232-(d+1)/2) to be held in the register Y_reg 182 (Z_reg=Zreg–Q·Yreg).

By repeating the first to the third steps described in the above until the degree of the polynomial held in the register U_reg 180 becomes smaller than the degree of the polynomial held in the register X_reg 184, a quotient Q(x) of a division of $R^{d-2}(x)$ held in the register U_reg 180 by $R^{d-1}(x)$ held in the register Y_reg 182 is obtained one term after another with a resulting residue as shown in the specific example in the following expression 33-1 to 33-3.

In the actual calculation of obtaining the quotient Q(x), the calculations of the subtractions (Ureg–Q·Xreg) and (Zreg–Q·Yreg) are performed simultaneously as shown in FIG. 8 to improve the arithmetic speed.

when $$R_{i-1}(x)/R_{i-2}=Q(x) \ldots R_i(x)$$

$$R_{i-1}=x^3+1, R_{i-2}=x+1,$$

(expression 33-1)
$$x+1 \overline{\smash{\big)}\, \begin{aligned} x^3 \phantom{+x^2} +1 \\ \underline{x^3+x^2} \\ -x^2+1 \end{aligned}} \phantom{xx} x^2$$

(expression 33-2)
$$x+1 \overline{\smash{\big)}\, \begin{aligned} -x^2 \phantom{+x} +1 \\ \underline{-x^2-x} \\ -x+1 \end{aligned}} \phantom{xx} (x^2)-X$$

(expression 33-3)
$$x+1 \overline{\smash{\big)}\, \begin{aligned} x+1 \\ \underline{x+1} \\ 0 \end{aligned}} \phantom{xx} (x^2-X)+1$$

$$Q(x)=x^2-x+1 \quad R_i(x)=0$$

(Data Width of Multiplier 210)

The reason why the multiplier 210 can be comprised of d multiplication circuits is now explained using a specific example.

The arithmetic result Q is applied to one input of each of d multipliers (number d–1~0) while each of the coefficients of the polynomial held in the register X_reg 184 and each of the coefficients of the polynomial held in the register Z_reg 186 are applied to the other input of each of the d multipliers successively in the order of the degrees with the lower degree first.

By this input application, the coefficients of the polynomial $m_{d-1}x^{d-1}+m_{d-2}x^{d-2}+ \ldots +m_0x^0$ held in the register X_reg 184 and the polynomial $n_{(d+1)/2-1}x^{(d+1)/2-1}+n_{(d+1)/2-2}x^{(d+1)/2-2}+ \ldots +n_0x^0$ held in the register Z_reg 186 are input to the (d–1)th~0th calculation circuits, respectively.

Because the number of terms of the arithmetic result Q obtained in the first step is 1, the number of times of multiplication required for performing the calculation of the second and the third steps is deg(X_reg)+deg(Z_reg)+2 (where X_reg, Z_reg are the polynomials held in the registers X_reg 184 and Z_reg 186, respectively).

According to deg $R_i$+deg $B_i \leq 2t-1$ ($i \geq 0$) which is derived by modifying;

$$\deg R_{i-1}+\deg B_i=2t(i \geq 0) \text{ and } \deg R_i \leq R_{i-1}1,$$

deg (X_reg)+deg (Z_reg)+2 is no greater than d so that it is known that the calculation can be performed by d multiplier circuits (reference 5, p.171).

As such, the arithmetic method described here allows the width of the input/output data of the multiplier 210 to be a minimum and the amount of hardwares to be reduced to a minimum.

(Exchange of Polynomial)

Figure 9:
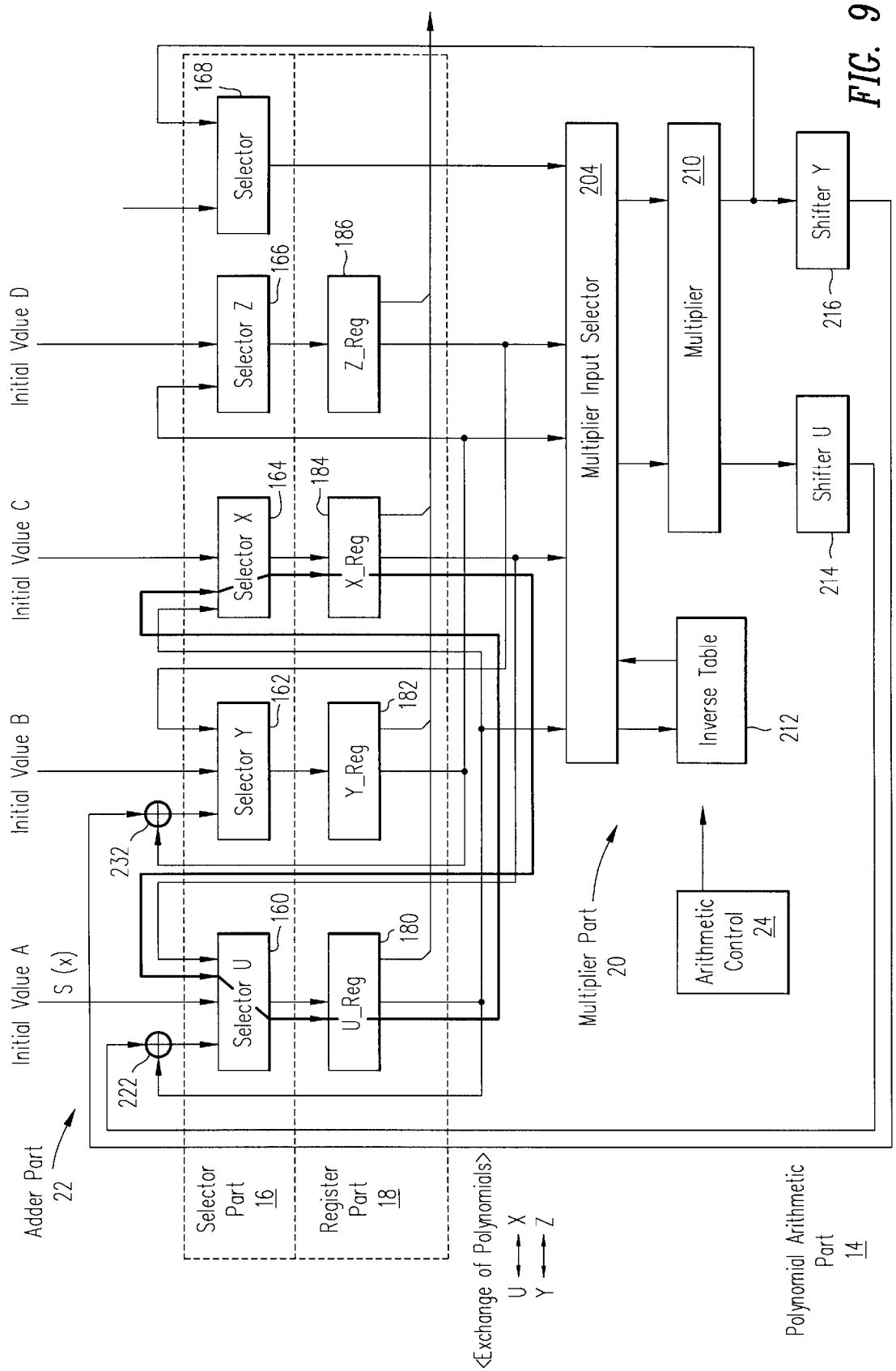
FIG. 9 is a diagram showing an operation to exchange polynomials held in registers in the polynomial arithmetic part shown in FIGS. 1 and 2.

FIG. 9 is a diagram showing the operation of exchanging polynomials held in registers in the polynomial arithmetic part 14 shown in FIGS. 1 and 2.

The arithmetic control part 24 controls the selector U 160, the selector X 164, the register U_reg 180, and the register X_reg 184, and connects the input of the register U_reg 180 to the output of the register X_reg 184 and the output of the register U_reg 180 to the input of the register X_reg 184 to cause the polynomial held in the register U_reg 180 to be held in the register X_reg 184 and the polynomial held in the register X_reg 184 to be held in the register U_reg 180 for exchanging the polynomials.

Similarly, the arithmetic control part 24 controls the selector Y 162, the selector Z 166, the register Y_reg 182, and the register Z_reg 186, to cause the polynomial held in the register Z_reg 186 to be held in the register Y_reg 182 and the polynomial held in the register Y_reg 182 to be held in the register Z_reg 186 for exchanging the polynomials.

Calculation of the Erasure Locator Polynomial λ(x)

Figure 10:
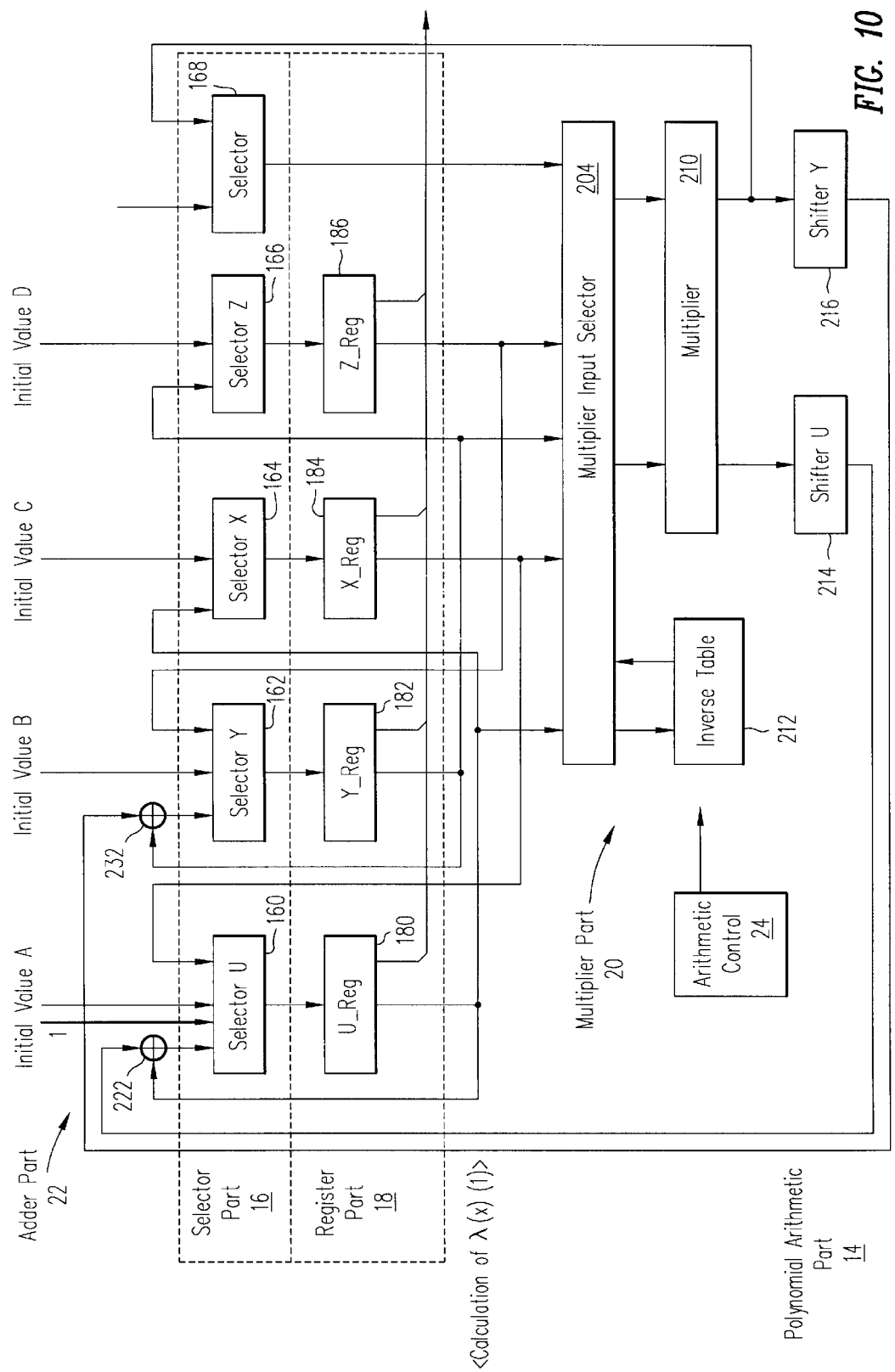
FIG. 10 is a diagram showing the first arithmetic operation in which the polynomial arithmetic part shown in FIGS. 1 and 2 calculates the erasure locator polynomial.
Figure 11:
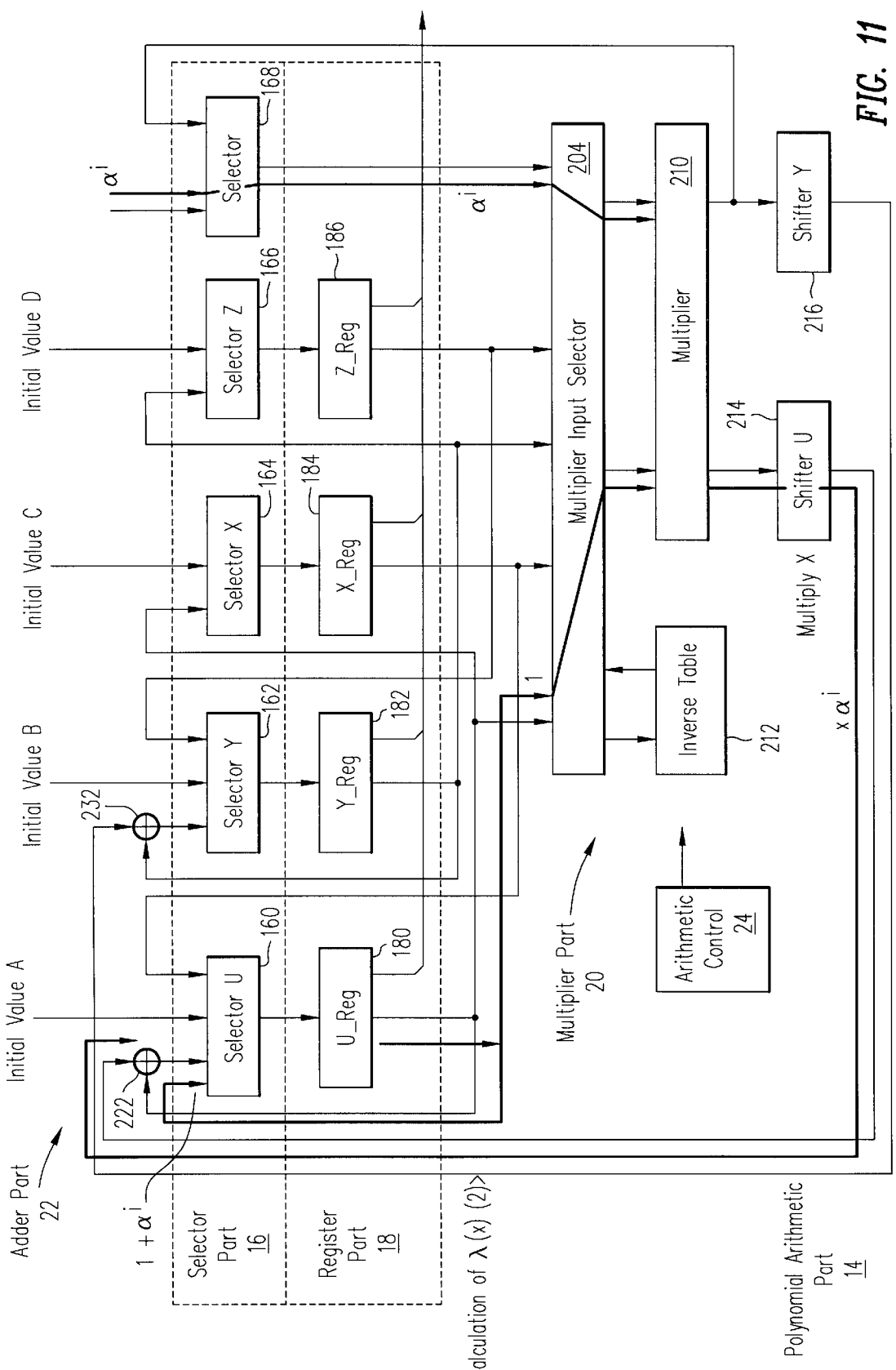
FIG. 11 is a diagram showing the second arithmetic operation in which the polynomial arithmetic part shown in FIGS. 1 and 2 calculates the erasure locator polynomial.

FIGS. 10 and 11 are the first and the second diagrams showing the arithmetic operation in which the polynomial arithmetic part 14 obtains the erasure locator polynomial.

As shown in FIGS. 10 and 11, the polynomial arithmetic part 14 performs a calculation similar to the derivation of the correction polynomial M(x) shown in FIGS. 4 and 5 to derive the erasure locator polynomial λ(x) and hold it in the register U_reg 180 (U_reg=λ(x), in the following table 2).

The difference between the calculation of the updated syndrome M(x) and the calculation of the erasure locator polynomial λ(x) lies only in that the initial value in calculating the updated syndrome M(x) is the syndrome polynomial S(x) while the initial value in obtaining the erasure locator polynomial λ(x) is a value 1.

When the polynomials σ(x), ω(x), λ(x) so far described are described in the form of a program, they are in the form shown in the following table 2.

When the arithmetic operation of this invention is performed using a hardware, registers corresponding to the variable TEMP shown in the table 2 are not necessary because the content of the registers can be exchanged using a circuit delay.

[Table 2]
Example of a program to obtain the polynomials
  σ(x), ω(x), λ(x)
>>>Set up Register<<<
Ureg=M(x)
Xreg=Ureg
Ureg=$x^{d-1}$
Yreg=0
Zreg=1
>>> derivation of σ(x), ω(x) <<<
while( ) {
  >>> derivation of Q(x) <<<
  while( ) {
    If (deg Ureg<deg Xreg) then exit
    Q=highest next term of Ureg/highest next term of Xreg
    Ureg=Ureg−Q*Xreg
    Yreg=Yreg−Q*Zreg
  }
  >>> Exchange of polynomials <<<
  TEMP=Ureg
  Ureg=Xreg
  Xreg=TEMP
  TEMP=Yreg
  Yreg=Zreg
  Zreg=TEMP
}
If (deg Xreg<Gauss [(d−1/h)/2] then exit >>> derivation of λ <<<
U_reg=λ(x)
}
where; Ureg, Yreg, Xreg, Zreg are the polynomials held in the registers U_reg 180~Z_reg 186,
  TEMP is a working variable required for implementation by a software,
  deg x is the degree of a polynomial x, and
  Gauss is a Gauss symbol.
Operation of the Decoding Apparatus 1

The operation of the decoding apparatus 1 is now described hereunder.

Figure 12:
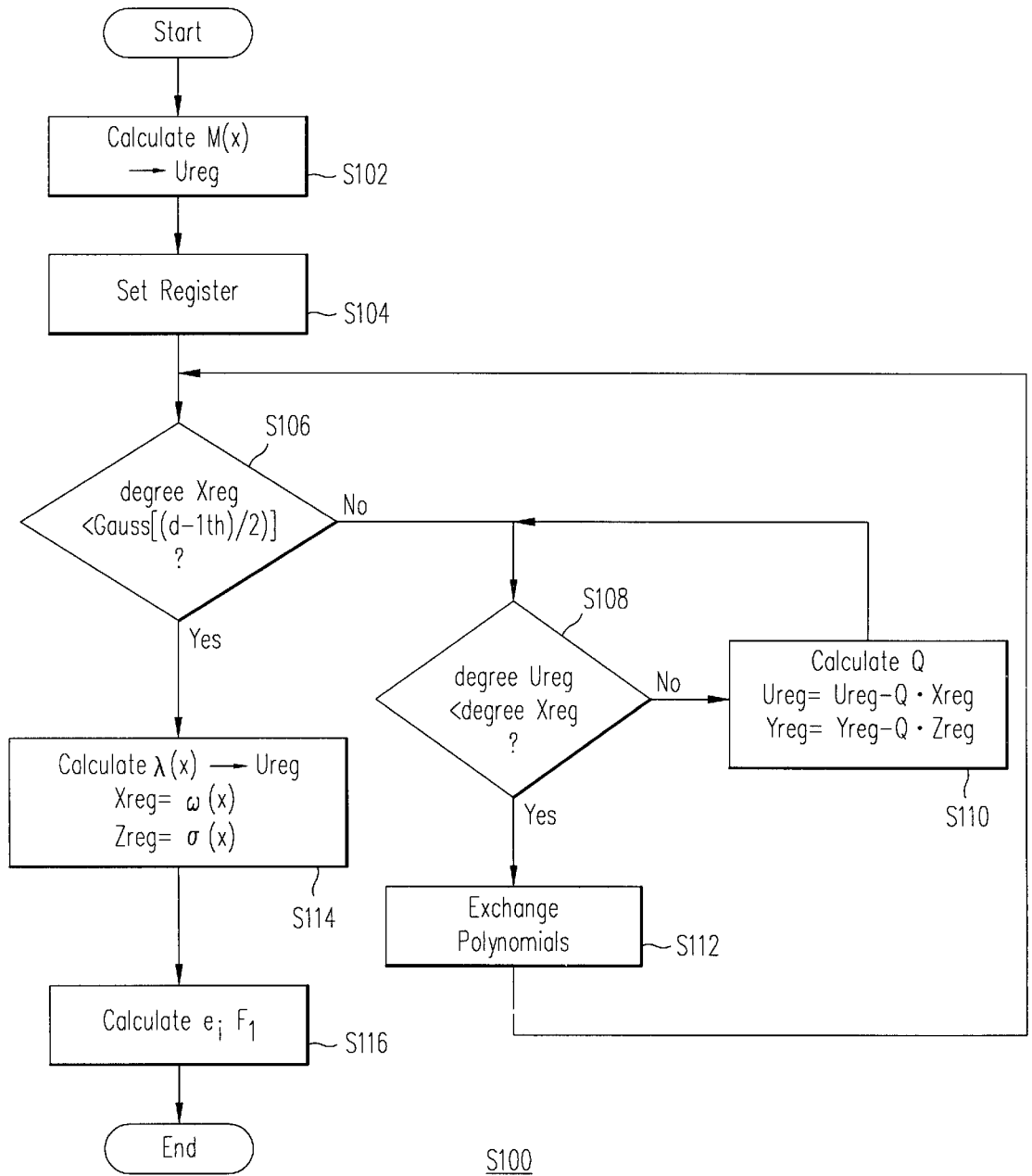
FIG. 12 is a flow chart showing the decoding operation of the decoding apparatus shown in FIG. 1.

FIG. 12 is a flow chart showing the decoding operation (S100) of the decoding apparatus 1 shown in FIG. 1.

As shown in FIG. 12, in step 102 (S102), when the demodulation part 100 (FIG. 1) demodulates produced/ transmitted signal and the receiving control part 102 outputs the received word polynomial R(x) and the erasure locator $\alpha^i$ to the error correction part 12, the syndrome generating part 124 of the error correction part 12 derives the syndrome polynomial S(x) while the polynomial arithmetic part 14 performs the operation 1 (expression 34) to derive the updated syndrome polynomial M(x) and hold them in the register U_reg 180.

$$S(x) \cdot \lambda(x) = x^h \cdot T_1(x) + T_2(x) \qquad \text{(expression 34)}$$

In step 104 (S104), the polynomial arithmetic part 14 starts the operation 2 (expression 35) to set up the registers. Specifically, the arithmetic control part 24 of the polynomial arithmetic part 14 moves the updated syndrome M(x) held in the register U_reg 180 to the register X_reg 184 to hold a coefficient $x^{d-1}$ in the register U_reg 180, a value 0 in the register Y_reg 182, and a value 1 in the register Z_reg 186.

$$T_1(x) \cdot \sigma(x) = \omega_e(x) \bmod x^{d-1-h} \qquad \text{(expression 35)}$$

In step 106 (S106), the arithmetic control part 24 determines whether or not the degree of the polynomial held in the register X_reg 184 is smaller than [(d−1+h)/2].

The arithmetic control part 24 proceeds to the process of S114 when the degree of the polynomial held in the register X_reg 184 is smaller than [(d+1+h)/2] while it proceeds to the process of S108 otherwise.

In step 108 (S108), the arithmetic control part 24 starts derivation of the quotient Q(x). The arithmetic control part 24 determines whether or not the degree of the polynomial held in the register U_reg 180 is smaller than the degree of the polynomial held in the register X_reg 184 and proceeds to the process of S114 when the degree of the polynomial held in the register U_reg 180 is smaller than the degree of the polynomial held in the register X_reg 184 while it proceeds to the process of S110 otherwise.

In step 110 (S110), the arithmetic control part 24 controls the components of the polynomial arithmetic part 14 to calculate the highest degree term (Q) in the quotient Q(x) resulted from a division of the polynomial held in the register U_reg 180 by the polynomial held in the register X_reg 184.

The arithmetic control part 24 also controls the components of the polynomial arithmetic part 14 to have it subtract the value of multiplication of the arithmetic result Q with the polynomial (Xreg) held in the register X_reg 184 from the polynomial (Ureg) held in the register U_reg 180 and hold the resulting polynomial in the register U_reg 180 (Ureg= Ureg−Q·Xreg).

The arithmetic control part 24 also controls the components of the polynomial arithmetic part 14 to have it subtract the value of multiplication of the arithmetic result Q with the polynomial (Zreg) held in the register Z_reg 186 from the polynomial (Yreg) held in the register Y_reg 182 and hold the resulting polynomial in the register Y_reg 182 (Yreg= Yreg−Q·Zreg).

In step 112 (S112), the arithmetic control part 24 also controls the components of the polynomial arithmetic part 14 to exchange the polynomial held in the register U_reg 180 with the polynomial held in the register X_reg 184 and the polynomial held in the register Y_reg 182 with the polynomial held in the register Z_reg 186.

In step 114 (S114), the polynomial arithmetic part 14 calculates the polynomial λ(x), holds it in the register U_reg 180 and outputs it to the error calculation/correction part 126.

The polynomial arithmetic part 14 outputs the polynomials ω(x), σ(x) calculated by the above calculation and held in the registers X_reg 184 and Z_reg 186 to the error calculation/correction part 126. (refer to expression 36)

$$\omega(x) = x^h \cdot \omega_e(x) + T_2(x) \cdot \sigma(x) \qquad \text{(expression 36)}$$

In step 116 (S116), the error calculation/correction part 126 calculates the error value $e_i$, the erasure value $E_i$, the correction position data i [$\sigma(\alpha^i)=0$] using the polynomials $\sigma(x)$, $\omega(x)$, $\lambda(x)$ and the erasure locator $\alpha^i$ input from the polynomial arithmetic part 14 to correct the received word stored in the buffer memory part 106.

The corrected received word is outputted as an output/transmitted signal by the transmission control part 108 and the modulation part 110.

Decoding Latency

In the decoding process of the polynomial arithmetic part 14, the decoding latency for the case where d is an odd number is $3(d-1)/2$ if there is no erasure while it is $2d-1$ if there is an erasure.

In decoding a received word on the Galois field (28) when d=11, for example, the degree of the error position polynomial is at most if there is no erasure while it is $[(10-h)/2]$ ([ ] is a Gaussian symbol) if there is an erasure.

In this case, the degree of the error/erasure value polynomial is 4 at most while it is $[(10+h)/2]-1$ (ditto) if the number of erasures is h.

Further, the degree of the erasure locator polynomial $\lambda(x)$ is equal to the number of erasures h and the syndrome polynomial S(x) will be 9 degrees because the number of the syndromes is 10.

The above description is summarized in the following table 3.

TABLE 3

| Number of Erasures | $\lambda(x)$ | $\lambda'(x)$ | $\sigma(x)$ | $\sigma'(x)$ | $\omega(x)$ |
|---|---|---|---|---|---|
| 0 | 0 | 0 | 5 | 4 | 4 |
| 1 | 1 | 0 | 4 | 2 | 4 |
| 2 | 2 | 0 | 4 | 2 | 5 |
| 3 | 3 | 2 | 3 | 2 | 5 |
| 4 | 4 | 2 | 3 | 2 | 6 |
| 5 | 5 | 4 | 2 | 0 | 6 |
| 6 | 6 | 4 | 2 | 0 | 7 |
| 7 | 7 | 6 | 1 | 0 | 7 |
| 8 | 8 | 6 | 1 | 0 | 8 |
| 9 | 9 | 8 | 0 | 0 | 8 |
| 10 | 10 | 8 | 0 | 0 | 9 |

Figure 13:
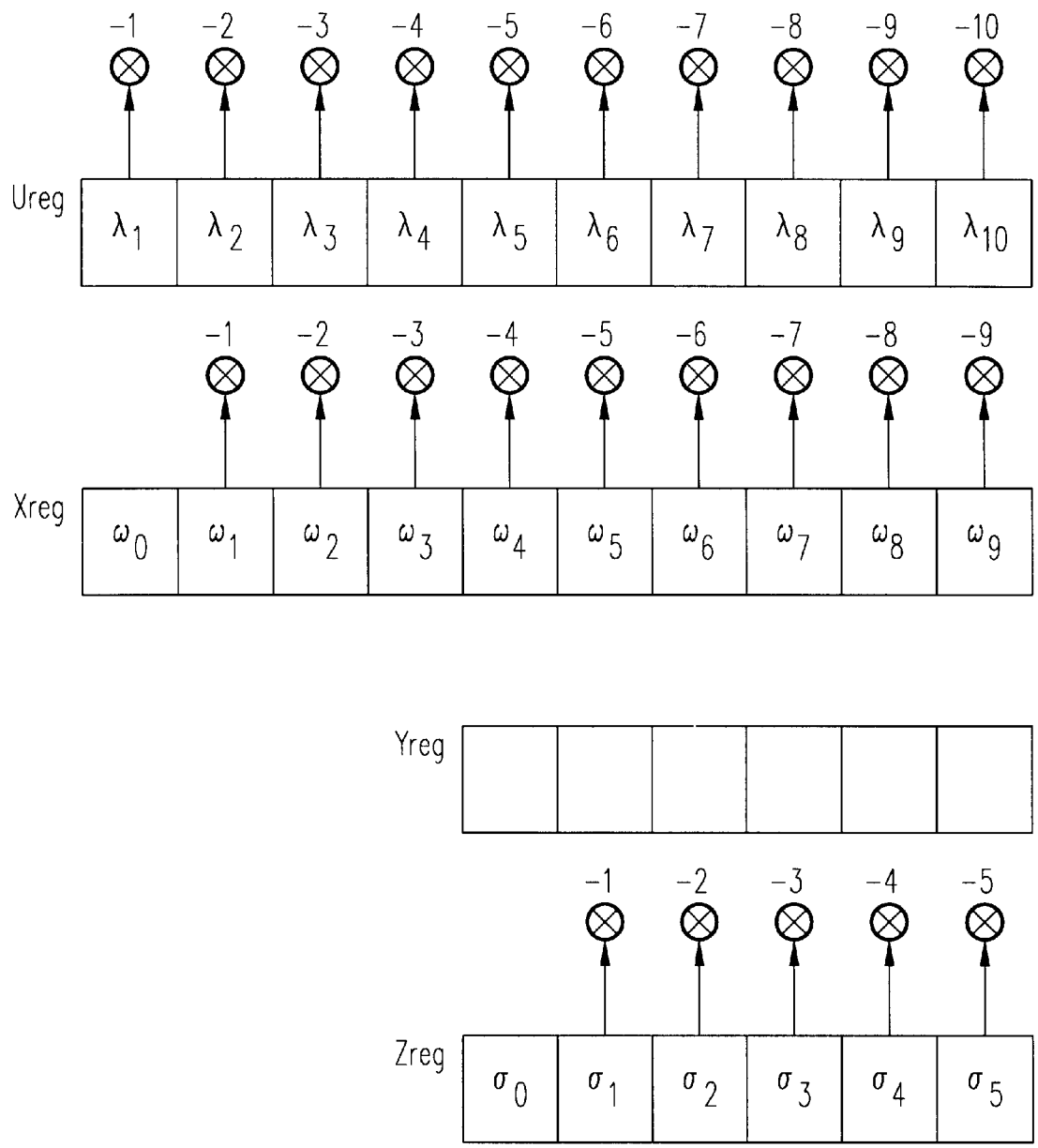
FIG. 13 is a diagram showing allocation of fixed multipliers to the registers in the decoding apparatus shown in FIG. 1.

FIG. 13 is a diagram showing the allocation of fixed multipliers to the registers in the decoding apparatus 1 shown in FIG. 1.

A fixed multiplier is associated to each register of the polynomial arithmetic part 14 for a chein search as shown in FIG. 13.

EFFECT OF THE INVENTION

According to the decoding apparatus, the arithmetic apparatus and the method therefor of this invention, a linear cyclic code can be decoded with less hardware than the prior art decoding apparatus.

According to the decoding apparatus, the arithmetic apparatus and the method therefor of this invention, a linear cyclic code can be decoded in a speed equal to or higher than the prior art decoding apparatus with less hardware than the prior art decoding apparatus.

What is claimed is:

1. A decoding apparatus comprising:
   erasure locator data calculating means for calculating erasure locator data $\alpha^i$ indicating the locator of erasure occurring in data encoded in a linear cyclic code R(x),
   syndrome polynomial calculating means for calculating a syndrome polynomial S(x) based on said calculated erasure locator data $\alpha^i$ and said linear cyclic code R(x),
   updated syndrome polynomial calculating means for calculating an updated syndrome polynomial M(x) based on said erasure locator data $\alpha^i$ and said calculated syndrome polynomial S(x),
   polynomial calculating means for calculating an error position polynomial $\sigma(x)$, an erasure locator polynomial $\lambda(x)$ and an error evaluator polynomial $\omega(x)$, based on said erasure locator data $\alpha^i$ and said calculated updated syndrome polynomial M(x), decoding means for calculating an error/erasure value $e_i/E_i$ to correct the error/erasure in said linear cyclic code R(x) for decoding based on said calculated error position polynomial $\sigma(x)$ said calculated erasure locator polynomial $\lambda(x)$, said calculated error evaluator polynomial $\omega(x)$, said error position data $\alpha^i$, and said linear cyclic code R(x),
   said polynomial calculating means performing according to recursive formulas:

$$\sigma_i(x)=\sigma_{i-2}(x)+Q_i(x)\cdot\sigma_{i-1}(x)$$
$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-1}(x)=1$, $\omega_{-1}(x)=x^{2t}$, $\sigma_0(x)=1$, $\omega_0(x)=M(x)$,
   until the degree of the polynomial $\omega_i$ becomes equal to or less than (where [ ] is a Gauss symbol, d is a minimum Hamming distance and h is the number of erasures) to calculate the error position polynomial $\sigma(x)$ and the error evaluator polynomial $\omega(x)$ for deriving the erasure locator polynomial $\lambda(x)$ from said erasure locator data $\alpha^i$,
   two first registers (registers U, X) having a data width equal to or greater than $k\cdot(d-1)/2$ bits (where k is a data length of a symbol included in said linear cyclic code),
   two second registers (registers Y, Z) having a data width equal to or greater than $k\cdot(d-1)/2$ bits: (where k is the data length of a symbol included in said linear cyclic code),
   multiplier/divider means for multiplying/dividing two multiplication/division data items,
   a data selector for selecting two of polynomials held by said registers, said erasure locator data $\alpha^i$ and the result of said multiplication/division to generate said two multiplication/division data items,
   a first adder means for adding said result of multiplication/division to data held in one of said first registers,
   a second adder means for adding said result of multiplication/division to the data held in one of said first registers,
   a shifter for shifting said result of multiplication/division,
   and arithmetic control means for causing these means to execute arithmetic processing to solve said recursive formulas.

2. An apparatus for calculating the error position polynomial $\sigma(x)$ and the error evaluator polynomial $\omega(x)$ from the updated syndrome polynomial M(x) in which said updated syndrome polynomial M(x) is calculated from the erasure locator data $\alpha^i$ indicating the locator of an erasure in data encoded in a linear cyclic code R(x) and the syndrome polynomial S(x), and said syndrome polynomial S(x) is calculated from said erasure locator data $\alpha^i$ and said linear cyclic code R(x), said arithmetic apparatus performing according to recursive formulas:

$$\sigma_i(x)=\sigma_{i-2}(x)+Q_i(x)\cdot\sigma_{i-1}(x)$$
$$\omega_i(x)=\omega_{i-2}(x)+Q_i(x)\cdot\omega_{i-1}(x)$$

where $Q_i(x)$ is a quotient of $\omega_{i-2}(x)/\omega_{i-1}(x)$, $\sigma_{-1}(x)=1$, $\omega_{-1}(x)=x^{2t}$, $\sigma_0(x)=1$, $\omega_0(x)=M(x)$, until the degree of the polynomial $\omega_i$ becomes equal to or less than (where [ ] is a Gauss symbol, d is a minimum Hamming distance and h is the number of erasures) to calculate the error position polynomial $\sigma(x)$ and the error evaluator polynomial $\omega(x)$, the apparatus comprising:

two first registers (registers U, X) having a data width equal to or greater than k·(d−1)/2 bits (where k is a data length of a symbol included in said linear cyclic code), two second registers (registers Y, Z) having a data width equal to or greater than k·(d−1)/2 bits (where k is the data length of a symbol included in said linear cyclic code), multiplier/divider means for multiplying/dividing two multiplication/division data items, a data selector for selecting two of polynomials held by said registers, said erasure locator data $\alpha^i$ and the result of said multiplication/division to generate said two multiplication/division data items, a first adder means for adding said result of multiplication/division to data held in one of said first registers, a second adder means for adding said result of multiplication/division to the data held in one of said first registers, a shifter for shifting said result of multiplication/division, and arithmetic control means for causing these means to execute arithmetic processing to solve said recursive formulas.

3. An arithmetic apparatus of claim 2 in which;

said arithmetic control means causes one of said first registers (register U), the other one of said first registers (register X), one of said second registers (register Y), and the other one of said second registers (register Z) to hold said updated syndrome polynomial M(x), a coefficient $x^{d-1}$ of said linear cyclic code R(x), and values 0 and 1, respectively, and repeats an arithmetic operation for calculating said Q(x) and an exchange processing of the polynomial held in said register X to derive said error evaluator polynomial $\omega(x)$ in said register X and said error position polynomial $\sigma(x)$ in said register Z, said arithmetic operation to calculate said Q(x) calculates the highest degree term Q of the quotient of a division of the polynomial held in said register U by the polynomial held in said register X, and repeats a process of causing said register U to hold a polynomial derived by subtracting a multiplication of the polynomial held in said register X with the calculated term Q from the polynomial held in said register X and a process of causing said register Y to hold a polynomial derived by subtracting a multiplication of the polynomial held in said register Y with the calculated term Q from the polynomial held in said register X until the degree of the polynomial held in said register U becomes less than the degree of the polynomial held in said register X, and said exchange of the polynomials held in said registers causes the polynomial held in said register U to be exchanged with the polynomial held in said register X, and causes the polynomial held in said register Y to be exchanged with the polynomial held in said register Z.

4. A decoding method comprising the steps of:

calculating erasure locator data $\alpha^i$ indicating the locator of an erasure occurring in data encoded in a linear cyclic code R(x), calculating a syndrome polynomial S(x) based on said calculated erasure locator data $\alpha^i$ and said linear cyclic code R(x), an updated syndrome polynomial calculating step for calculating an updated syndrome polynomial M(x) based on said erasure locator data $\alpha^i$ and said calculated syndrome polynomial S(x), calculating an error position polynomial $\sigma(x)$, an erasure locator polynomial $\lambda(x)$ and an error evaluator polynomial $\omega(x)$ based on said erasure locator data $\alpha^i$ and said calculated updated syndrome polynomial M(x), and calculating error/erasure values $e_i/E_i$ based on said calculated error position polynomial $\sigma(x)$, said calculated erasure locator polynomial $\lambda(x)$, said calculated error evaluator polynomial $\omega(x)$, said error position data $\alpha^i$ and said linear cyclic code R(x) to correct an error/erasure in said linear cyclic code R(x) for decoding, including:

a process of repeating a recursive formula:

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/(\omega_{i-1}(x)$, $\sigma_{-1}(x)=1$, $\omega_{-1}(x)=x^{2t}$, $\sigma_0(x)=1$, $\omega_0(x)=M(x)$, until the degree of the polynomial $\omega_i$ becomes equal to or less than (where [ ] is a Gauss symbol, d is a minimum Hamming distance and h is the number of erasures) to calculate the error position polynomial $\sigma(x)$ and the error evaluator polynomial $\omega(x)$, calculating an erasure locator polynomial $\lambda(x)$ from said erasure locator data $\alpha^i$, generating two first registers (registers U, X) having a data width equal to or greater than k·(d−1)/2 bits (where k is a data length of a symbol included in said linear cyclic code), generating two second registers (registers Y, Z) having a data width equal to or greater than k·(d−1)/2 bits (where k is the data length of a symbol included in said linear cyclic code), multiplying/dividing two multiplication/division data items, selecting two of polynomials held by said registers, said erasure locator data $\alpha^i$ and the result of said multiplication/division to generate said two multiplication/division data items, adding said result of multiplication/division to data held in one of said first registers, adding said result of multiplication/division to the data held in one of said first registers, shifting said result of multiplication/division.

5. A method for calculating an error position polynomial $\sigma(x)$ and an error evaluator polynomial $\omega(x)$ from the updated syndrome polynomial M(x) in which said updated syndrome polynomial M(x) is calculated from erasure locator data $\alpha^i$ indicating a location of an erasure in the linear cyclic code R(x) and the syndrome polynomial S(x) and said syndrome polynomial S(x) is calculated from said erasure locator data $\alpha^i$ and said linear cyclic code R(x), said method repeating calculations according to recursive formulas;

$$\sigma_i(x)=\sigma_{i-2}(x)+Q_i(x)\cdot\sigma_{i-1}(x)$$

$$\omega_i(x)=\omega_{i-2}(x)+Q_i(x)\cdot\omega_{i-1}(x)$$

where $Q_i(x)$ is a quotient of $\omega_{i-2}(x)/(\omega_{i-1}(x)$, $\sigma_{-1}(x)=1$, $\omega_{-i}(x)=x^{2t}$, $\sigma_0(x)=1$, $\omega_0(x)=M(x)$, until the degree of the polynomial $\omega_i$ becomes equal to or less than (where [ ] is a Gauss symbol, d is a minimum Hamming distance and h is the number of erasures) to calculate the error position polynomial $\sigma(x)$ and the error evaluator polynomial $\omega(x)$, generating two first registers (registers U, X) having a data width equal to or greater than k(d−1)/2 bits (where k is a data length of a symbol included in said linear cyclic code), generating two second registers (registers Y, Z) having a data width equal to or greater than k·(d−1)/2 bits (where k is the data length of a symbol included in said linear cyclic code), multiplying/dividing two multiplication/division data items, selecting two of polynomials held by said registers, said erasure locator data $\alpha^i$ and the result of said multiplication/division to generate said two multiplication/division data items, adding said result of multiplication/division to data held in one of said first registers, adding said result of multiplication/division to the data held in one of said first registers, shifting said result of multiplication/ division.

* * * * *